United States Patent
Matsunaga et al.

(10) Patent No.: US 10,424,502 B2
(45) Date of Patent: Sep. 24, 2019

(54) SUBSTRATE TRANSFER DEVICE AND BONDING SYSTEM

(71) Applicant: TOKYO ELECTRON LIMITED, Tokyo (JP)

(72) Inventors: Masataka Matsunaga, Koshi (JP); Takahiro Masunaga, Koshi (JP); Takashi Koga, Koshi (JP); Yasuharu Iwashita, Koshi (JP); Shingo Katsuki, Koshi (JP); Masaaki Umitsuki, Koshi (JP); Kazutoshi Ishimaru, Koshi (JP); Fumio Sakata, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/644,318

(22) Filed: Jul. 7, 2017

(65) Prior Publication Data
US 2018/0019153 A1  Jan. 18, 2018

(30) Foreign Application Priority Data
Jul. 12, 2016  (JP) ................. 2016-137633

(51) Int. Cl.
*H01L 21/683* (2006.01)
*H01L 21/67* (2006.01)
(Continued)

(52) U.S. Cl.
CPC .... *H01L 21/6838* (2013.01); *H01L 21/67092* (2013.01); *H01L 21/67103* (2013.01);
(Continued)

(58) Field of Classification Search
CPC ............. H01L 21/67201; H01L 21/68; H01L 21/6838; B29C 65/7802; Y10T 156/1744
(Continued)

(56) References Cited

U.S. PATENT DOCUMENTS

2015/0318198 A1* 11/2015 Kuwahara .............. H01L 21/68
414/222.02
2016/0001543 A1*  1/2016 Akiyama ............ B32B 38/1833
156/64

FOREIGN PATENT DOCUMENTS

JP  2008027930 A  *  2/2008 ............ C03C 27/00
JP  2009267043 A  * 11/2009
(Continued)

OTHER PUBLICATIONS

English translation of JP-2012175043.*
(Continued)

*Primary Examiner* — Sonya M Sengupta
(74) *Attorney, Agent, or Firm* — Nath, Goldberg & Meyer; Jerald L. Meyer

(57) ABSTRACT

A substrate transfer device for transferring a first substrate and a second substrate to a bonding apparatus configured to bond the first substrate and the second substrate, includes a first holding part configured to hold the first substrate from an upper surface side, a lower surface of the first substrate serving as a bonding surface, and a second holding part provided below the first holding part and configured to hold the second substrate from a lower surface side so that the second substrate faces the first substrate, a upper surface of the second substrate serving as a bonding surface to be bonded to the lower surface of the first substrate.

7 Claims, 20 Drawing Sheets

(51) Int. Cl.
  *H01L 21/68* (2006.01)
  *B29C 65/78* (2006.01)
  *H01L 21/687* (2006.01)

(52) U.S. Cl.
  CPC .. *H01L 21/67201* (2013.01); *H01L 21/67248* (2013.01); *H01L 21/68* (2013.01); *H01L 21/681* (2013.01); *H01L 21/68707* (2013.01); *B29C 65/7802* (2013.01); *Y10T 156/1744* (2015.01)

(58) Field of Classification Search
  USPC ............................................. 156/556
  See application file for complete search history.

(56) References Cited

FOREIGN PATENT DOCUMENTS

| | | | |
|---|---|---|---|
| JP | 2010245396 A | * 10/2010 | |
| JP | 2015-18919 A | 1/2015 | |
| WO | WO-2012114826 A1 | * 8/2012 | ....... H01L 21/67092 |

OTHER PUBLICATIONS

English translation of WO2012/114826.*
English translation of ISR for WO2012/114826.*
English translation of JP2008027930.*
English translation of JP2009267043.*
English translation of JP2010245396.*

* cited by examiner

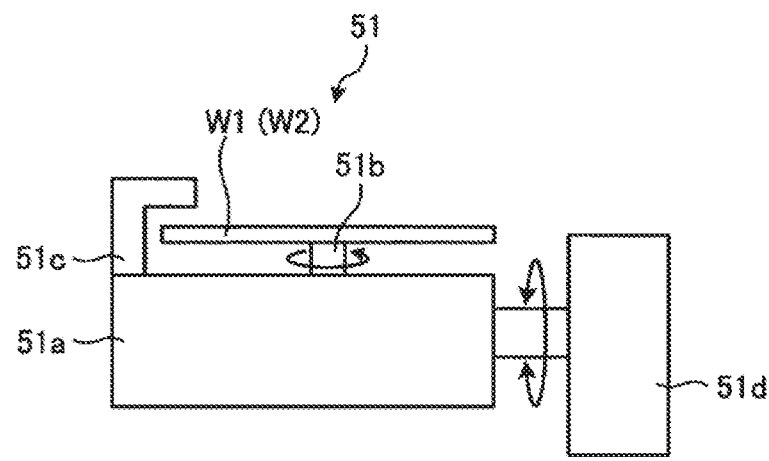
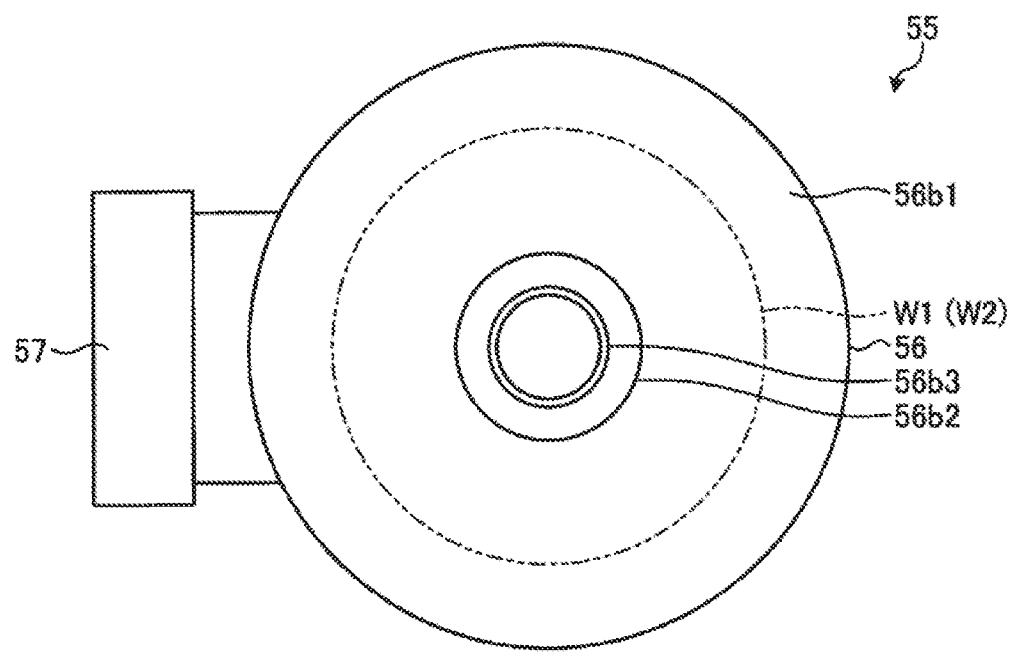

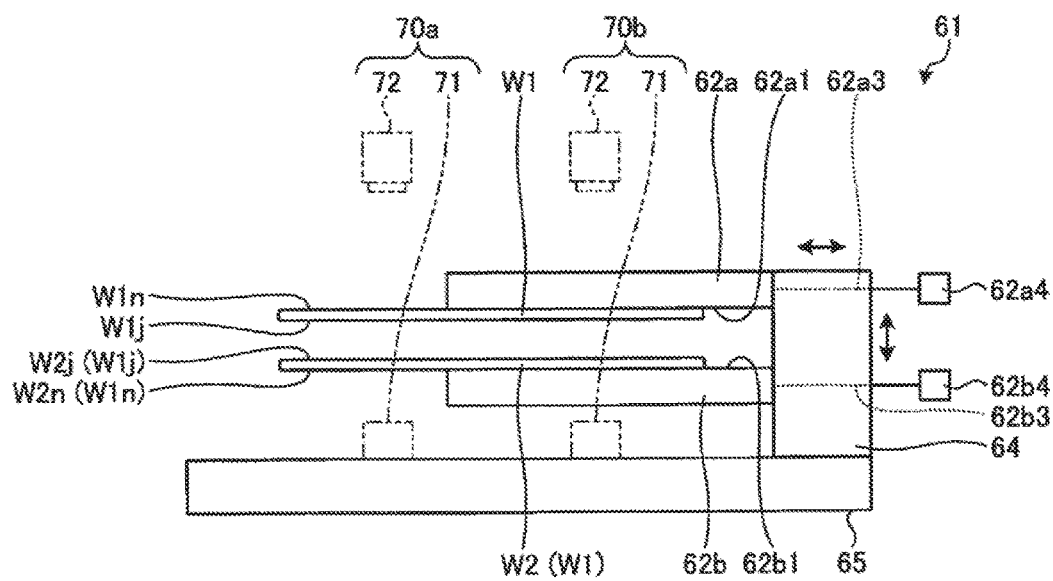
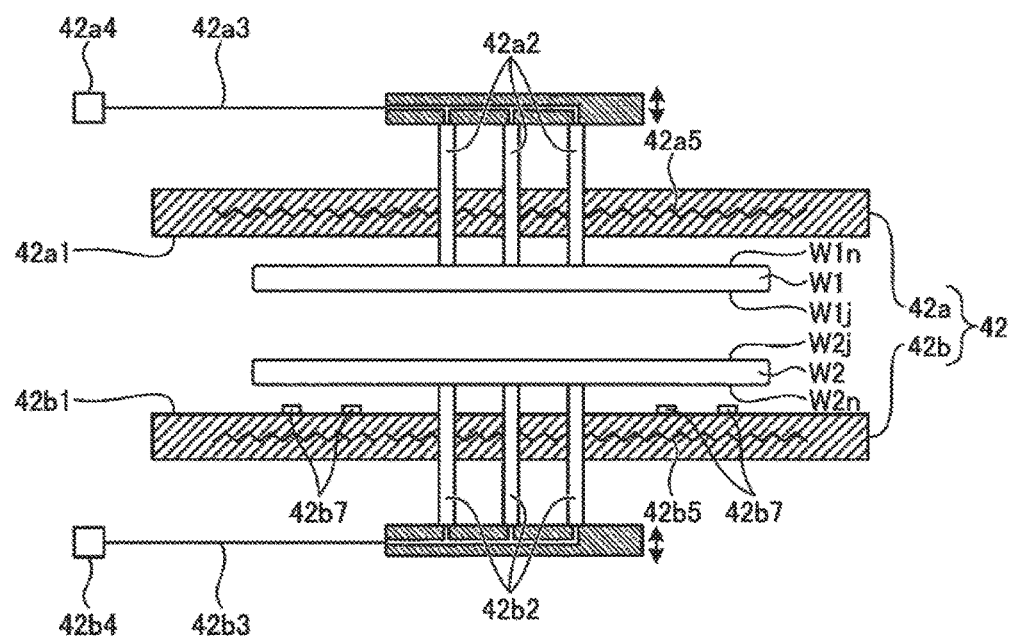

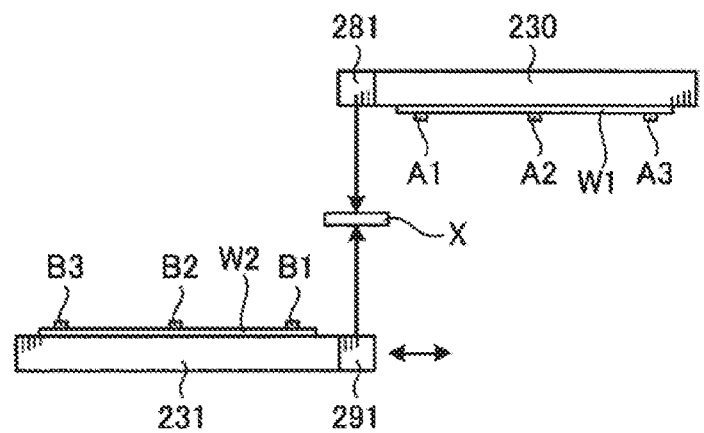
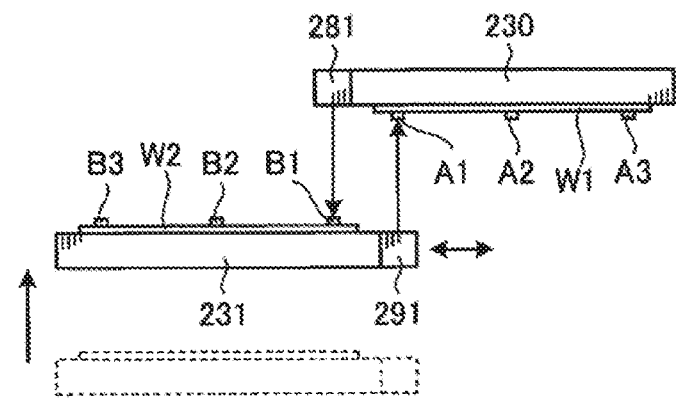
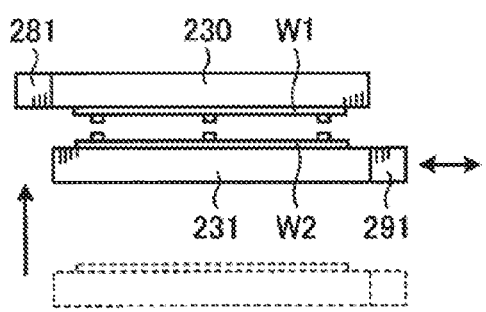

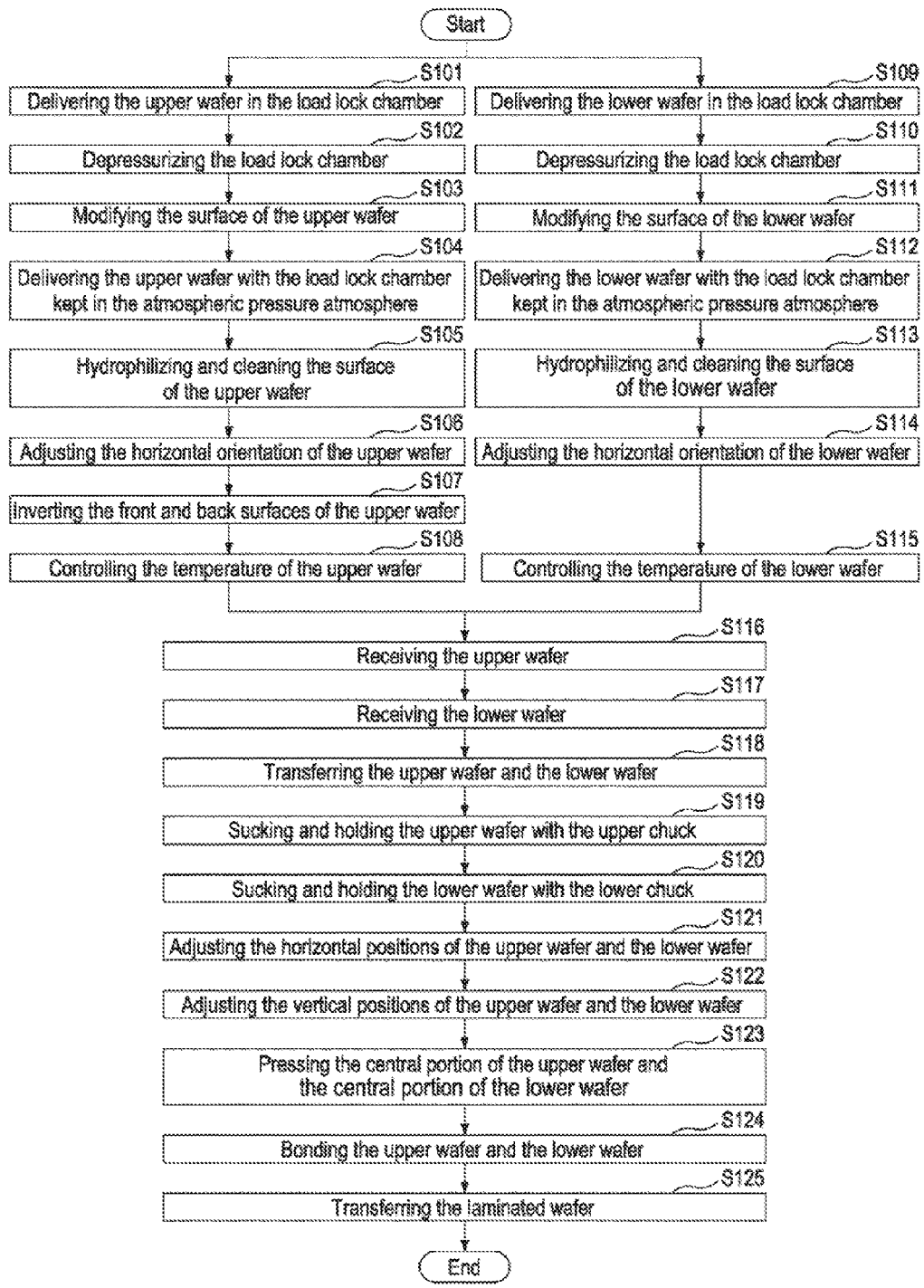

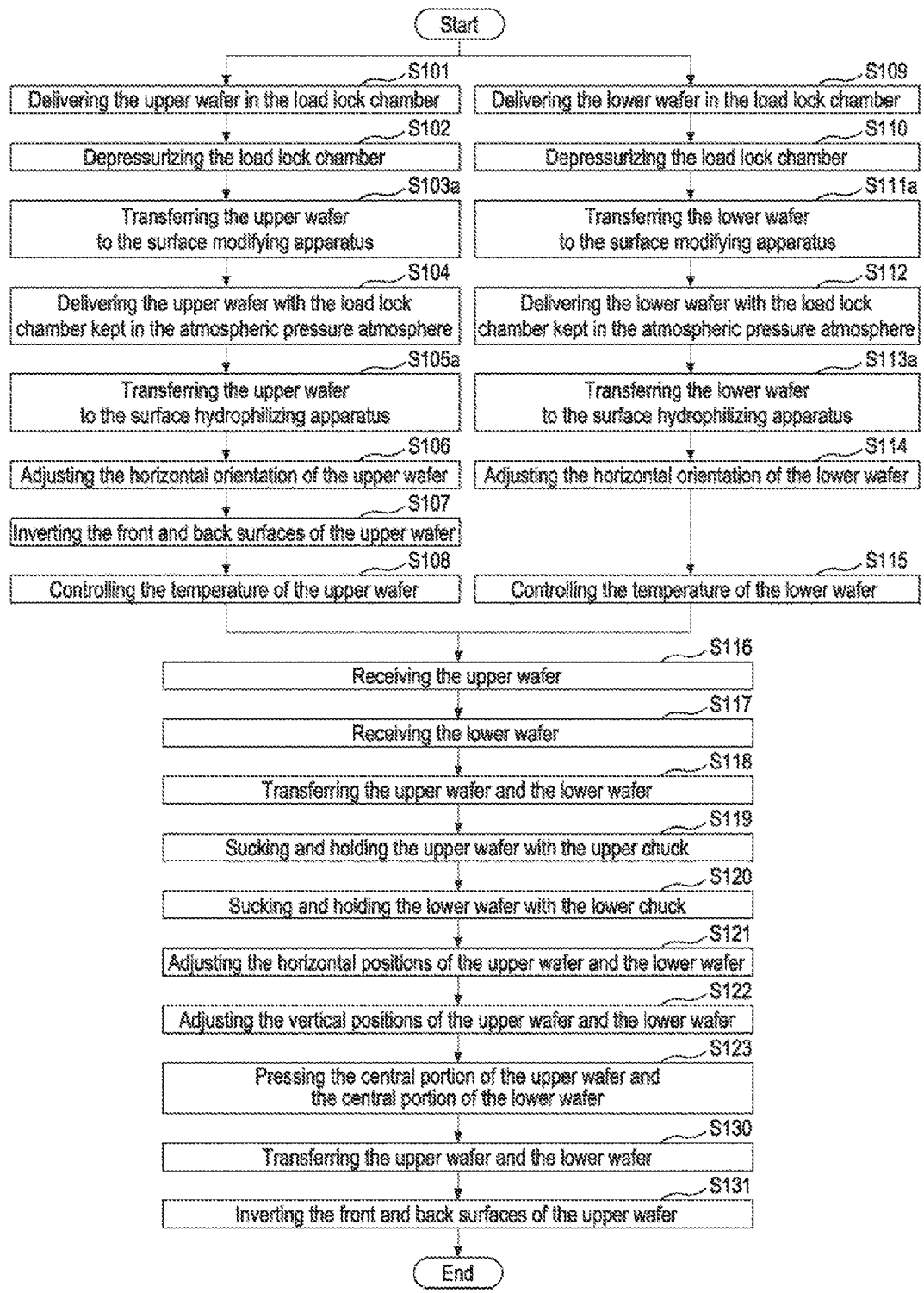

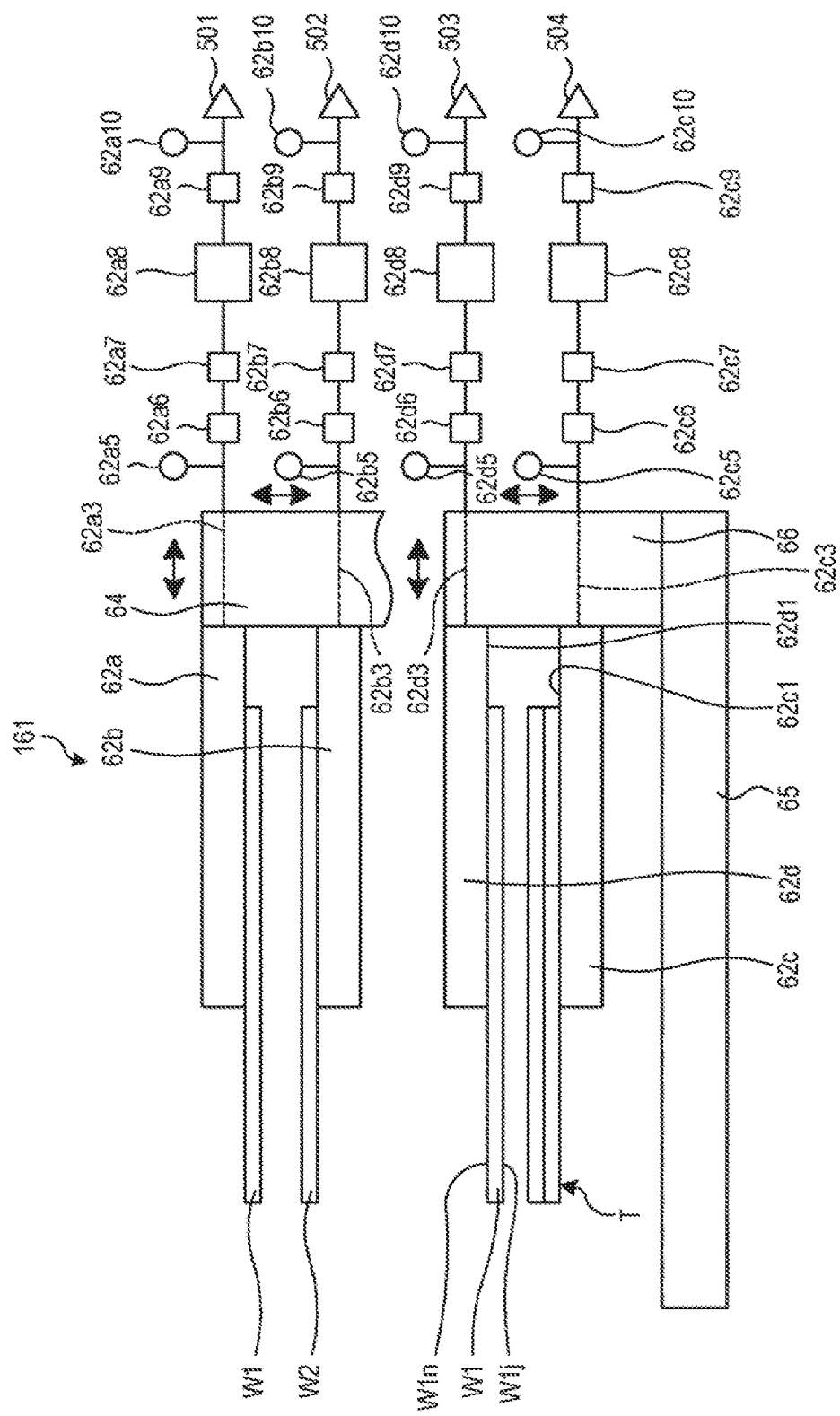

SUBSTRATE TRANSFER DEVICE AND BONDING SYSTEM

CROSS-REFERENCE TO RELATED APPLICATION

This application is based upon and claims the benefit of priority from Japanese Patent Application No. 2016-137633, filed on Jul. 12, 2016, the entire contents of which are incorporated herein by reference.

TECHNICAL FIELD

The present disclosure relates to a substrate transfer device and a bonding system.

BACKGROUND

In order to meet the demand for higher integration of semiconductor devices, use of a three-dimensional integration technique to stack semiconductor devices in three dimensions has been proposed. Systems adopting this three-dimensional integration technique utilize a bonding system for bonding substrates such as, e.g., semiconductor wafers (hereinafter referred to as "wafers") or the like.

Such a bonding system includes a surface modifying apparatus for modifying the surfaces of first and second substrates to be bonded, a hydrophilizing apparatus for hydrophilizing the modified first and second substrates, and a bonding apparatus for bonding the hydrophilized first and second substrates by a van der Waals force and hydrogen bonding (an intermolecular force). The bonding system further includes a substrate transfer device for transferring the first and second substrates between the respective apparatuses.

However, in the bonding system described above, the substrate transfer device transfers the first and second substrates to the bonding apparatus in a state in which the bonding surfaces of the first and second substrates serve as upper surfaces. Then, the bonding apparatus performs a bonding process after inverting the transferred first substrate and causing the bonding surface of the first substrate to serve as a lower surface so that the bonding surface faces the second substrate.

Therefore, in the bonding apparatus, a processing time is required to invert the substrate. In the bonding system described above, there is room for further improvement in terms of shortening the processing time of bonding the substrates in the bonding apparatus.

SUMMARY

Some embodiments of the present disclosure provide a substrate transfer device and a bonding system capable of shortening a processing time of bonding substrates in a bonding apparatus.

According to one embodiment of the present disclosure, there is provided a substrate transfer device for transferring a first substrate and a second substrate to a bonding apparatus configured to bond the first substrate and the second substrate, including a first holding part configured to hold the first substrate from an upper surface side, a lower surface of the first substrate serving as a bonding surface, and a second holding part provided below the first holding part and configured to hold the second substrate from a lower surface side so that the second substrate faces the first substrate, a upper surface of the second substrate serving as a bonding surface to be bonded to the lower surface of the first substrate.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 4 is a schematic side view showing a configuration of a position adjusting device.

FIG. 5A is a schematic plan view showing a configuration of an inverting transition.

FIG. 6B is a schematic side view showing the configuration of the transfer device.

FIG. 7 is a schematic side view showing a configuration of a substrate temperature control device.

FIG. 14A is an operation explanation view of the bonding apparatus.

FIG. 14B is an operation explanation view of the bonding apparatus.

FIG. 14C is an operation explanation view of the bonding apparatus.

FIG. 15 is a flowchart showing a part of a processing procedure of a process executed by the bonding system.

FIG. 16 is a flowchart showing a part of a processing procedure of a process executed by the bonding system in a test mode.

FIG. 20 is a view showing a modification of the transfer device shown in FIG. 18.

DETAILED DESCRIPTION

Hereinafter, embodiments of a bonding system disclosed herein will be described in detail with reference to the accompanying drawings. Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

<1. Configuration of Bonding System>

Figure 1:
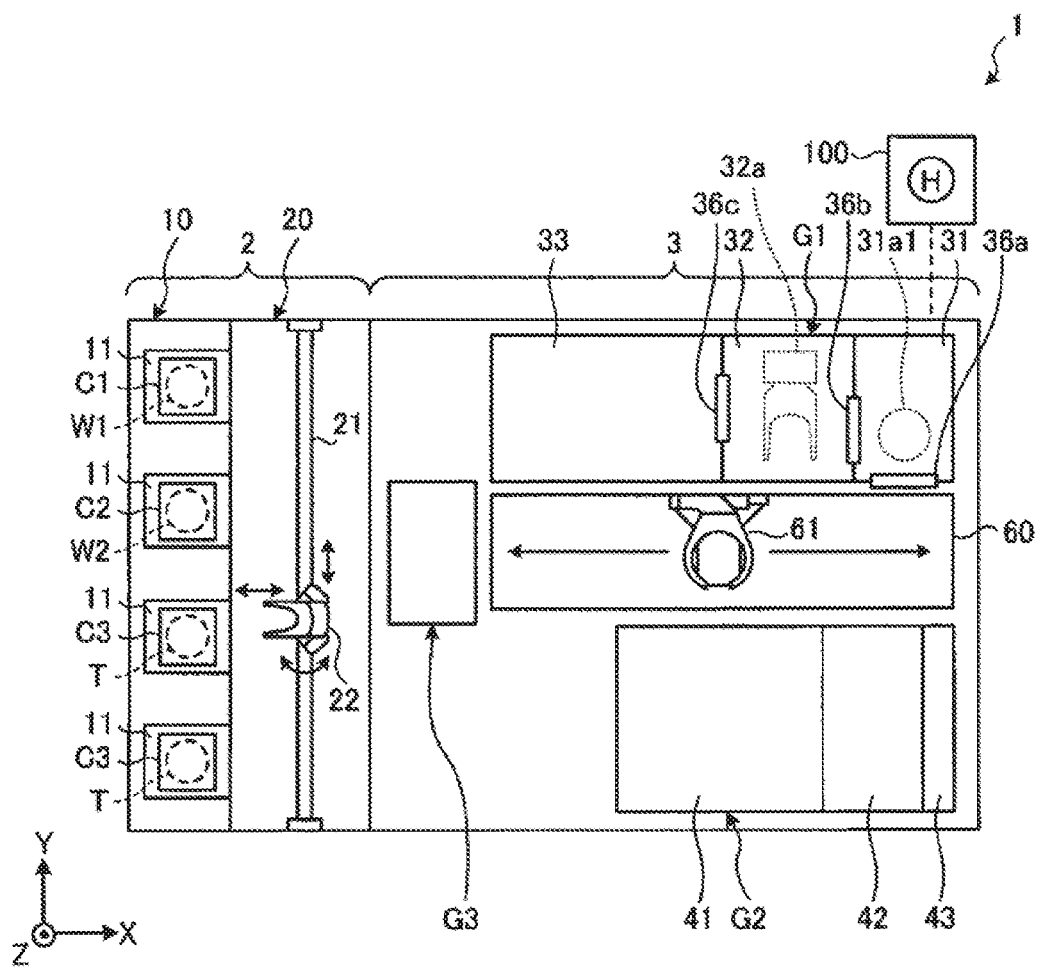
FIG. 1 is a schematic plan view showing a configuration of a bonding system according to a first embodiment.
Figure 2:
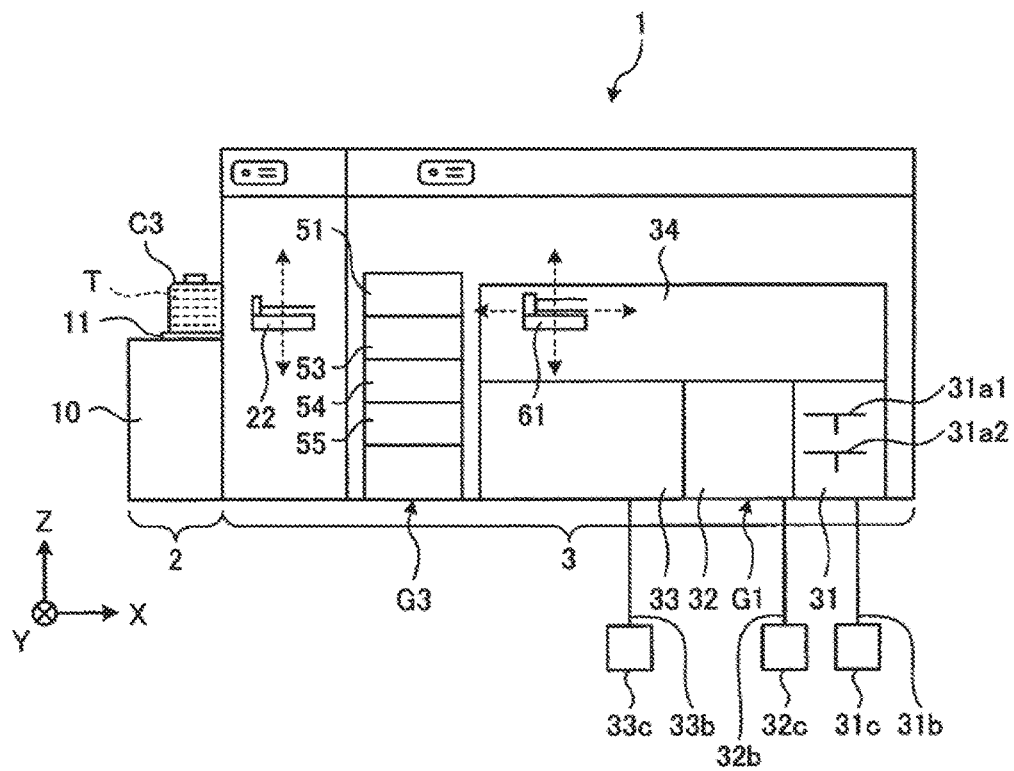
FIG. 2 is a schematic side view showing the configuration of the bonding system according to the first embodiment.
Figure 3:
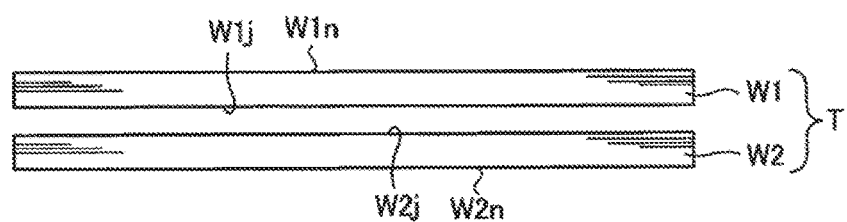
FIG. 3 is a schematic side view of a first substrate and a second substrate.

First, a configuration of a bonding system according to a first embodiment will be described with reference to FIGS. 1 and 2. FIG. 1 is a schematic plan view showing a configuration of a bonding system according to a first embodiment, and FIG. 2 is a schematic side view thereof. Further, FIG. 3 is a schematic side view of a first substrate and a second substrate. In the following description, in order to clarify the positional relationship, an X axis direction, a Y axis direction and a Z axis direction orthogonal to each other are defined. The Z axis positive direction is defined as a vertical upward direction. In each of the drawings including FIGS. 1 to 3, only the components necessary for explanation are shown, and the illustration of general components may be omitted in some cases.

The bonding system 1 according to this embodiment shown in FIG. 1 is configured to form a laminated substrate T by bonding a first substrate W1 and a second substrate W2 (see FIG. 3).

The first substrate W1 is, for example, a substrate in which a plurality of electronic circuits is formed on a semiconductor substrate such as a silicon wafer or a compound semiconductor wafer. The second substrate W2 is, for example, a bare wafer in which no electronic circuit is formed. The first substrate W1 and the second substrate W2 have approximately the same diameter.

An electronic circuit may be formed on the second substrate W2. As the aforementioned compound semiconductor wafer, it may be possible to use, for example, a wafer which contains gallium arsenide, silicon carbide, gallium nitride, indium phosphide or the like. However, the present disclosure is not limited thereto.

In the following description, the first substrate W1 may be referred to as "upper wafer W1", the second substrate W2 may be referred to as "lower wafer W2", and the laminated substrate T may be referred to as "laminated wafer T."

In the following description, as shown in FIG. 3, the substrate surface of the upper wafer W1 to be bonded to the lower wafer W2 will be referred to as "bonding surface W1$j$" and the substrate surface on the side opposite to the bonding surface W1$j$ will be referred to as "non-bonding surface W1$n$." Likewise, the substrate surface of the lower wafer W2 to be bonded to the upper wafer W1 will be referred to as "bonding surface W2$j$" and the substrate surface on the side opposite to the bonding surface W2$j$ will be referred to as "non-bonding surface W2$n$."

As shown in FIG. 1, the bonding system 1 includes a loading/unloading station 2 and a processing station 3. The loading/unloading station 2 and the processing station 3 are arranged side by side in the order of the loading/unloading station 2 and the processing station 3 along the X axis positive direction. The loading/unloading station 2 and the processing station 3 are integrally connected to each other.

The loading/unloading station 2 includes a mounting table 10 and a transfer region 20. The mounting table 10 includes a plurality of mounting plates 11. On the respective mounting plates 11, cassettes C1, C2 and C3 for accommodating a plurality of substrates (for example, 25 substrates) in a horizontal state are mounted, respectively. The cassette C1 is a cassette for accommodating the upper wafer W1, the cassette C2 is a cassette for accommodating the lower wafer W2, and the cassette C3 is a cassette for accommodating the laminated wafer T. In the cassettes C1 and C2, the upper wafer W1 and the lower wafer W2 are accommodated with their orientations aligned such that the bonding surfaces W1$j$ and W2$j$ face upward.

The transfer region 20 is disposed adjacent to the mounting table 10 on the side of the X axis positive direction. In the transfer region 20, a transfer path 21 extending in the Y axis direction and a transfer device 22 movable along the transfer path 21 are provided. The transfer device 22 is also movable in the X axis direction and is rotatable around the Z axis. The transfer device 22 transfers the upper wafer W1, the lower wafer W2 and the laminated wafer T between the cassettes C1 to C3 mounted on the mounting plates and the third processing block G3 of the processing station 3 to be described later.

The number of cassettes C1 to C3 mounted on the mounting plates 11 is not limited to that shown in the drawings. In addition to the cassettes C1, C2 and C3, a cassette for recovering a defective substrate or the like may be mounted on the mounting plates 11.

In the processing station 3, a plurality of, for example, three, processing blocks G1, G2 and G3 having various apparatuses are provided. For example, a first processing block G1 is provided on the rear side of the processing station 3 (on the side of the Y axis positive direction in FIG. 1), and a second processing block G2 is provided on the front side of the processing station 3 (the side of the Y axis negative direction in FIG. 1). A third processing block G3 is provided on the loading/unloading station 2 side (on the side of the X axis negative direction in FIG. 1) of the processing station 3.

In a region surrounded by the first processing block G1 to the third processing block G3, a transfer region 60 is formed. In the transfer region 60, a transfer device 61 is disposed. The transfer device 61 includes a transfer arm which is movable in the vertical direction and the horizontal direction and rotatable around the vertical axis. A detailed configuration of the transfer device 61 will be described later with reference to FIGS. 6A and 6B.

The transfer device 61 moves within the transfer region 60 and transfers the upper wafer W1, the lower wafer W2 and the laminated wafer T to predetermined apparatuses disposed in the first processing block G1, the second processing block G2 and the third processing block G3 adjacent to the transfer region 60.

In this regard, the transfer of the upper wafer W1, the lower wafer W2 and the laminated wafer T by the transfer device 61 is performed in a normal pressure atmosphere. The normal pressure is, for example, an atmospheric pressure. However, the normal pressure does not need to be exactly the same as the atmospheric pressure and may include a pressure range of, for example, ±10 kPa with respect to the atmospheric pressure. In addition, the transfer device 61 is an example of a substrate transfer device.

In the first processing block G1, a load lock chamber 31, a transfer chamber 32, a surface modifying apparatus 33 and a surface hydrophilizing apparatus 34 (see FIG. 2) are disposed.

The load lock chamber 31 is located at a position most distant from the loading/unloading station 2 in the first processing block G1 and is disposed adjacent to the Y axis positive direction side of the transfer region 60 via a gate valve 36a. The transfer chamber 32 is disposed adjacent to the X axis negative direction side of the load lock chamber 31 via a gate valve 36b, and the surface modifying apparatus 33 is located at a position closest to the loading/unloading station 2 in the first processing block G1 and is disposed adjacent to the X axis negative direction side of the transfer chamber 32 via a gate valve 36c.

In the load lock chamber 31, the upper wafer W1 and the lower wafer W2 are delivered between the transfer device 61 and the surface modifying apparatus 33. Specifically, a plurality of transitions 31a1 and 31a2 is provided inside the load lock chamber 31 (see FIG. 2). The transitions 31a1 and 31a2 are configured to mount the upper wafer W1 or the lower wafer W2.

In this embodiment, for example, the transition 31a1 mounts the upper wafer W1 or the lower wafer W2 loaded from the transfer device 61 into the surface modifying apparatus 33, and the transition 31a2 mounts the upper wafer W1 or the lower wafer W2 unloaded from the surface modifying apparatus 33 to the transfer device 61.

As shown in FIG. 2, the transitions 31a1 and 31a2 are stacked and disposed in the vertical direction. However, the present disclosure is not limited thereto. For example, the transitions 31a1 and 31a2 may be disposed so as to be adjacent to each other in a plan view. The transitions 31a1 and 31a2 are an example of a substrate mounting table.

A vacuum pump 31c (see FIG. 2) is connected to the load lock chamber 31 via a suction pipe 31b. Thus, for example, when the gate valves 36a and 36b are closed and when the vacuum pump 31c is operated, the interior of the load lock chamber 31 is depressurized into a depressurized atmosphere. On the other hand, for example, when the gate valve 36a is opened, the interior of the load lock chamber 31 communicates with the transfer region 60 whose interior is kept under an atmospheric pressure atmosphere. Thus, the atmosphere in the load lock chamber 31 becomes an atmospheric pressure atmosphere. As described above, the load lock chamber 31 is configured so that the atmosphere in the load lock chamber 31 can be switched between the atmospheric pressure atmosphere and the depressurized atmosphere.

In the transfer chamber 32, a transfer device for surface modifying apparatus (hereinafter referred to as "modifying transfer device") 32a is disposed. The modifying transfer device 32a includes, for example, a transfer arm which is movable in the vertical direction and the horizontal direction and rotatable around the vertical axis. The modifying transfer device 32a receives, for example, the unmodified upper wafer W1 or the like mounted on the transition 31a1 of the load lock chamber 31 and transfers the unmodified upper wafer W1 to the surface modifying apparatus 33. Furthermore, the modifying transfer device 32a transfers the upper wafer W1 or the like modified in the surface modifying apparatus 33 to the load lock chamber 31 and mounts/places the upper wafer W1 or the like on the transition 31a2 (see FIG. 2).

A vacuum pump 32c (see FIG. 2) is connected to the transfer chamber 32 via a suction pipe 32b. When the vacuum pump 32c is operated, the interior of the transfer chamber 32 is depressurized into a depressurized atmosphere. The gate valve 36b is opened when the load lock chamber 31 is in the depressurized atmosphere. Similarly, the gate valve 36c is opened when the surface modifying apparatus 33 is in the depressurized atmosphere.

Therefore, the transfer chamber 32 is constantly kept under the depressurized atmosphere by the vacuum pump 32c. In this way, the modifying transfer device 32a of the transfer chamber 32 is disposed adjacent to the load lock chamber 31 and is configured to transfer the upper wafer W1 and the lower wafer W2 between the load lock chamber 31 and the surface modifying apparatus 33 under the depressurized atmosphere.

The surface modifying apparatus 33 is configured to modify the bonding surfaces W1$j$ and W2$j$ of the upper wafer W1 and the lower wafer W2. A vacuum pump 33c (see FIG. 2) is connected to the surface modifying apparatus 33 via a suction pipe 33b. When the vacuum pump 33c is operated, the interior of the surface modifying apparatus 33 is depressurized into a depressurized atmosphere. As with the transfer chamber 32, the surface modifying apparatus 33 is also constantly kept in the depressurized atmosphere.

Therefore, the surface modifying apparatus 33 modifies the bonding surfaces W1$j$ and W2$j$ of the upper wafer W1 and the lower wafer W2 under the depressurized atmosphere. More specifically, the surface modifying apparatus 33 breaks the bonds of $SiO_2$ on the bonding surfaces W1$j$ and W2$j$ of the upper wafer W1 and the lower wafer W2 to form single-bond $SiO_2$, thereby modifying the bonding surfaces W1$j$ and W2$j$ so that the bonding surfaces W1$j$ and W2$j$ can be subsequently hydrophilized with ease.

In the surface modifying apparatus 33, an oxygen gas, which is a process gas, is excited into plasma under a processing apparatus and is ionized. Then, the bonding surfaces W1$j$ and W2$j$ of the upper wafer W1 and the lower wafer W2 are irradiated with the oxygen ions, whereby the bonding surfaces W1$j$ and W2$j$ are subjected to plasma treatment and are modified.

The internal volume of the load lock chamber 31 described above is set to become smaller than the internal volume of the surface modifying apparatus 33 or the transfer chamber 32. However, the present disclosure is not limited thereto.

Now, the transfer of the upper wafer W1 in the load lock chamber 31, the transfer chamber 32 and the surface modifying apparatus 33 configured as above will be described in detail. Since the lower wafer W2 is transferred in the same manner as the upper wafer W1, the following description is also generally applicable to the transfer of the lower wafer W2. It is assumed that the gate valves 36a. 36b and 36c are all closed.

Specifically, first, when the unmodified upper wafer W1 is transferred to the front of the load lock chamber 31 by the transfer device 61, the gate valve 36a is opened and the unmodified upper wafer W1 is mounted on the transition 31a1 of the load lock chamber 31. In addition, when the unmodified upper wafer W1 is mounted on the transition 31a1, there may be a case where the upper wafer W1 or the lower wafer W2 already modified in the previous process is mounted on the transition 31a2. In such a case, after mounting the unmodified upper wafer W1 on the transition 31a1, the transfer device 61 may receive the upper wafer W1 or the lower wafer W2 mounted on the transition 31a2 and may remove the upper wafer W1 or the lower wafer W2 from the load lock chamber 31.

Next, the gate valve 36a is closed, the vacuum pump 31c is operated, and the load lock chamber 31 is depressurized into a depressurized atmosphere.

Next, the gate valves 36b and 36c are opened, and the modifying transfer device 32a transfers the upper wafer W1 mounted on the transition 31a1 to the surface modifying apparatus 33. Subsequently, the gate valves 36b and 36c are closed, and the modifying process of the upper wafer W1 is performed by the surface modifying apparatus 33.

When the modifying process is completed, the gate valves 36b and 36c are opened. The modifying transfer device 32a takes out the upper wafer W1 from the surface modifying apparatus 33 and transfers the upper wafer W1 to the transition 31a2 of the load lock chamber 31. Next, after the gate valves 36b and 36c are closed, the gate valve 36a is opened so that the internal atmosphere of the load lock chamber 31 is switched from the depressurized atmosphere to the atmospheric pressure atmosphere.

Then, the transfer device 61 takes out the modified upper wafer W1 from the transition 31a2 of the load lock chamber 31 and transfers the modified upper wafer W1 to the surface hydrophilizing apparatus 34 where the next process is performed.

As described above, the bonding system 1 according to the present embodiment includes the load lock chamber 31 in which the upper wafer W1 and the lower wafer W2 are delivered between the transfer device 61 and the surface modifying apparatus 33 and in which the atmosphere can be switched between the atmospheric pressure atmosphere and the depressurized atmosphere.

Thus, in the bonding system 1, it is possible to shorten the processing time of the upper wafer W1 and the lower wafer W2. That is to say, when the upper wafer W1 and the lower wafer W2 are loaded and unloaded to and from the surface modifying apparatus 33, if the internal pressure of the load lock chamber 31 is made switchable, it is possible for the surface modifying apparatus 33 to carry out the modifying process while maintaining the depressurized atmosphere. Accordingly, in the surface modifying apparatus 33, the process of switching the atmospheric pressure atmosphere to the depressurized atmosphere is not required. This makes it possible to shorten the time required for the modifying process of the upper wafer W1 and the lower wafer W2.

The internal volume of the load lock chamber 31 is set to become smaller than the internal volume of the surface modifying apparatus 33 or the transfer chamber 32. This makes it possible to shorten the time required for switching the internal pressure of the load lock chamber 31 as compared with the time required for switching the internal pressure of the surface modifying apparatus 33.

Furthermore, the modifying transfer device 32a is not disposed in the load lock chamber 31 but is disposed adjacent to the load lock chamber 31. Thus, the load lock chamber 31 can be reduced in size as compared with the case where the modifying transfer device 32a is disposed in the load lock chamber 31. As a result, it is possible to further shorten the time required for switching the internal pressure of the load lock chamber 31.

The surface hydrophilizing apparatus 34 (see FIG. 2) hydrophilizes and cleans the bonding surfaces W1j and W2j of the upper wafer W1 and the lower wafer W2 by a hydrophilization treatment liquid such as, for example, pure water or the like. In the surface hydrophilizing apparatus 34, for example, pure water is supplied onto the upper wafer W1 or the lower wafer W2 while rotating the upper wafer W1 or the lower wafer W2 held by a spin chuck. As a result, the pure water supplied onto the upper wafer W1 or the lower wafer W2 diffuses on the bonding surface W1j or W2j of the upper wafer W1 or the lower wafer W2, whereby the bonding surface W1j or W2j is made hydrophilic.

As shown in FIG. 2, in the first processing block G1, the load lock chamber 31, the transfer chamber 32, the surface modifying apparatus 33 and the surface hydrophilizing apparatus 34 are disposed in a stacked state. More specifically, for example, in the first processing block G1, the load lock chamber 31, the transfer chamber 32 and the surface modifying apparatus 33 are disposed in the lower stage on the Z axis negative direction side, while the surface hydrophilizing apparatus 34 is disposed in the upper stage on the Z axis positive direction side.

As described above, in this embodiment, the load lock chamber 31, the transfer chamber 32 and the surface modifying apparatus 33 are disposed below the surface hydrophilizing apparatus 34. Thus, for example, the vacuum pumps 31c, 32c and 33c and the suction pipes 31b, 32b and 33b connected to the load lock chamber 31, the transfer chamber 32 and the surface modifying apparatus 33 can be collectively disposed below the bonding system 1. This makes it possible to downsize the entire system.

Furthermore, the vacuum pumps 31c, 32c and 33c are disposed in the vicinity of the load lock chamber 31, the transfer chamber 32 and the surface modifying apparatus 33. It is therefore possible to shorten the suction pipes 31b, 32b and 33b, eventually minimizing the time required for depressurization.

The arrangement positions of the load lock chamber 31, the surface modifying apparatus 33 and the surface hydrophilizing apparatus 34 shown in FIG. 1 are illustrative and not limitative. That is to say, the load lock chamber 31 and the surface modifying apparatus 33 may be disposed above the surface hydrophilizing apparatus 34. Furthermore, for example, the load lock chamber 31 and the surface modifying apparatus 33 may be disposed in the second processing block G2 or the third processing block G3. Moreover, for example, a new station may be provided at a position on the X axis positive direction side of the processing station 3 or between the loading/unloading station 2 and the processing station 3. The load lock chamber 31 and the surface modifying apparatus 33 may be disposed in the new station.

In the second processing block G2, a bonding apparatus 41, a substrate temperature control device 42 and an exhaust port 43 are disposed. The bonding apparatus 41 is located at a position closest to the loading/unloading station 2 in the second processing block G2. The substrate temperature control device 42 is disposed adjacent to the bonding apparatus 41 on the X axis positive direction side thereof. The substrate temperature control device 42 is disposed adjacent to the exhaust port 43 on the X axis negative direction side thereof.

The bonding apparatus 41 bonds the hydrophilized upper wafer W1 and the hydrophilized lower wafer W2 by an intermolecular force. The detailed configuration of the bonding apparatus 41 will be described later with reference to FIGS. 8 to 14H.

The substrate temperature control device 42 controls the temperature of the upper wafer W1 before bonding and the temperature of the lower wafer W2 before bonding, respectively. The detailed configuration of the substrate temperature control device 42 will be described later with reference to FIG. 7.

The exhaust port 43 discharges a temperature control gas (hereinafter referred to as "temperature control air"). That is to say, although not shown in the drawings, the processing station 3 is provided with an air supply port which is disposed at an appropriate position such as, for example, a ceiling portion on the side of the loading/unloading station 2 or the like so as to supply the temperature control air. The exhaust port 43 is configured to discharge the temperature control air supplied from the air supply port and passing through the processing station 3 to the outside of the processing station 3.

Therefore, in the processing station 3, the bonding apparatus 41, the substrate temperature control device 42 and the exhaust port 43 are disposed in this order along the flow direction of the temperature control air (the X axis positive direction). In other words, the substrate temperature control device 42 is disposed on the downstream side of the bonding apparatus 41 in the flow direction of the temperature control air.

The arrangement position of the exhaust port 43 is not limited to the example shown in the drawing. The exhaust port 43 may be disposed at other positions, for example, in the vicinity of the load lock chamber 31 or in the vicinity of the transfer region 60. Furthermore, the position of the air supply port is not limited to the one described above. The air supply port may be disposed at other positions such as a floor portion or a wall portion of the processing station 3.

As shown in FIG. 2, in the third processing block G3, a position adjusting device 51, transitions 53 and 54, and an inverting transition 55 are stacked and arranged sequentially from the upper side. The arrangement locations of the respective devices in the third processing block G3 are merely illustrative and not limitative.

FIG. 4 is a schematic side view showing a configuration of the position adjusting device 51. The position adjusting device 51 adjusts the horizontal orientations of the upper wafer W1 and the lower wafer W2. As shown in FIG. 4, the position adjusting device 51 includes a base 51a, a holding part 51b configured to suck, hold and rotate the upper wafer W1 and the lower wafer W2, a detecting part 51c configured to detect a position of a notch portion of each of the upper wafer W1 and the lower wafer W2, and a base inverting part 51d configured to invert the base 51a.

In the position adjusting device 51, the position of the notch portion of each of the upper wafer W1 and the lower wafer W2 is detected by the detecting part 51c while rotating the upper wafer W1 and the lower wafer W2 sucked and held by the holding part 51b, whereby the horizontal orientations of the upper wafer W1 and the lower wafer W2 are adjusted by adjusting the positions of the notch portions.

In the detecting part 51c, for example, a camera (not shown) may be provided so as to capture images of the peripheral edges of the upper wafer W1 and the lower wafer W2. For example, the detecting part 51c captures an image of the peripheral edge of the upper wafer W1 or the like while rotating the upper wafer W1 or the like held by the holding part 51b by one rotation, and plots the peripheral edge of the upper wafer W1 or the like based on the captured image. The detecting part 51c may detect the radius of the upper wafer W1 and the lower wafer W2 based on the information on the peripheral edge of the upper wafer W1 or the like thus plotted.

In this manner, the position adjusting device 51 also functions as a radius detecting device for detecting the radius of the upper wafer W1 and the lower wafer W2. In the above description, the radius of the upper wafer W1 or the like is detected by the position adjusting device 51. However, the present disclosure is not limited thereto. For example, identification information (ID) indicating the radius or the like may be attached to the upper wafer W1 or the like. The radius may be detected by reading such identification information.

The base inverting part 51d includes, for example, a motor and the like. The base inverting part 51d is connected to the base 51a and is configured to invert the base 51a for each upper wafer W1 held by the holding part 51b. Thus, the front and back surfaces of the upper wafer W1 held by the holding part 51b are inverted. Accordingly, for example, the upper wafer W1 whose horizontal orientation is adjusted comes into a state in which the bonding surface W1j serves as a lower surface (see FIG. 2) by the above-described inversion. In this state, the upper wafer W1 is unloaded from the position adjusting device 51. The upper wafer W1 and the lower wafer W2 unloaded from the position adjusting device 51 are transferred to the substrate temperature control device 42 and are temperature-controlled.

Returning to the description of FIG. 2, the upper wafer W1 transferred by the transfer device 22 or the transfer device 61 is temporarily mounted on the transition 53. Furthermore, the lower wafer W2 or the laminated wafer T transferred by the transfer device 22 or the transfer device 61 is temporarily mounted on the transition 54.

The inverting transition 55 is a device used in a test mode to be described later and configured to temporarily hold the upper wafer W1 or the lower wafer W2 returned from the bonding apparatus 41 in a state in which the bonding surface W1j or W2j serves as a lower surface. The inverting transition 55 is an example of a substrate transfer device.

Figure 5B:
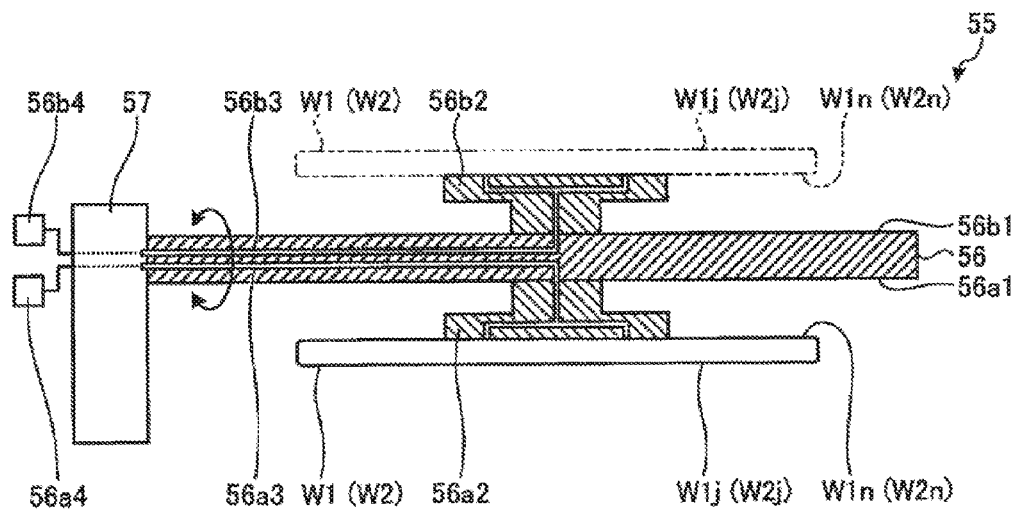
FIG. 5B is a schematic side view showing the configuration of the inverting transition.

FIG. 5A is a schematic plan view showing the configuration of the inverting transition 55, and FIG. 5B is a schematic side view showing the configuration of the inverting transition 55. As shown in FIG. 5B, the inverting transition 55 includes a holding part 56 and an inverting mechanism 57. The holding part 56 holds, on the side of a lower surface 56a1 thereof, the upper wafer W1 or the lower wafer W2 having the bonding surface W1j or W2j as a lower surface.

Specifically, the holding part 56 is provided with a suction portion 56a2 on the side of a lower surface 56a1 thereof. A vacuum pump 56a4 is connected to the suction portion 56a2 via a suction pipe 56a3. Therefore, the lower surface 56a1 of the holding part 56 holds the upper wafer W1 or the lower wafer W2 through vacuum suction by the operation of the vacuum pump 56a4. As a result, the holding part 56 can reliably hold the upper wafer W1 and the like.

The holding part 56 is further provided with a suction portion 56b2 on the side of an upper surface 56b1 thereof. A vacuum pump 56b4 is connected to the suction portion 56b2 via a suction pipe 56b3. Therefore, the upper surface 56b1 of the holding part 56 is configured to be able to suck the upper wafer W1 or the like by the operation of the vacuum pump 56b4.

The inverting mechanism 57 includes, for example, a motor and the like. The inverting mechanism 57 is connected to the holding part 56 and is configured to invert the front and back surfaces of the upper wafer W1 or the like held by the holding part 56. The inverting mechanism 57 of the inverting transition 55 inverts the upper wafer W1 not bonded by the bonding apparatus 41, for example, in a test mode.

Specifically, the upper wafer W1 having the bonding surface W1j as a lower surface is transferred by the transfer device 61 to the inverting transition 55 and is held by the suction portion 56a2. Next, the inverting mechanism 57 inverts the holding part 56 so that the upper wafer W1 comes into a state in which the bonding surface W1j thereof serves as an upper surface. The upper wafer W1 in such a state is shown by imaginary lines in FIGS. 5A and 5B. The test mode in which the inverting transition 55 is used will be described later.

Figure 6A:
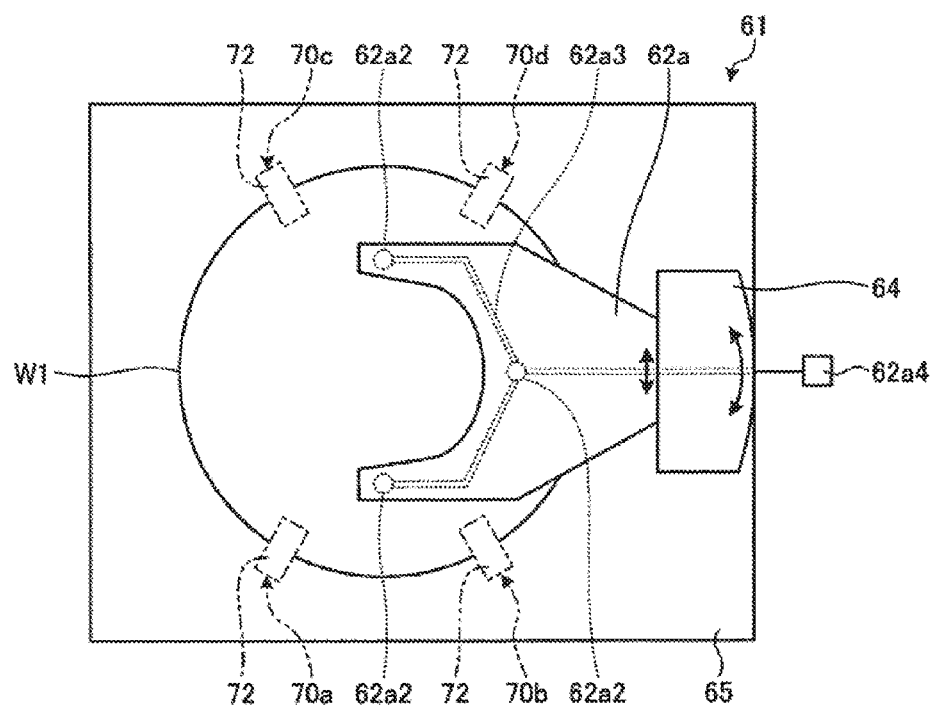
FIG. 6A is a schematic plan view showing a configuration of a transfer device.

Next, the configuration of the transfer device 61 will be described with reference to FIGS. 6A and 6B. FIG. 6A is a schematic plan view showing the configuration of the transfer device 61, and FIG. 6B is a schematic side view showing the configuration of the transfer device 61.

As shown in FIG. 6B, the transfer device 61 includes a first holding part 62a, a second holding part 62b provided below the first holding part 62a, and a first driving part 64. As the first holding part 62a and the second holding part 62b, it may be possible to use a bifurcated fork whose lateral width is smaller than the diameter of the upper wafer W1 or the like. However, the present disclosure is not limited thereto.

In this embodiment, the first holding part 62a is used for holding the upper wafer W1 having the bonding surface W1j as a lower surface. On the other hand, the second holding part 62b is used for holding the lower wafer W2 having the bonding surface W2j as an upper surface, the upper wafer W1 having the bonding surface W1j as an upper surface, the laminated wafer T, and the like. The types of the respective wafers held by the first holding part 62a and the second holding part 62b are illustrative and not limitative. For example, the first holding part 62a may hold the laminated wafer T.

In the first holding part 62a, a plurality of suction portions 62a2 (indicated by broken lines in FIG. 6A) is provided on the side of a lower surface 62a1 thereof. A vacuum pump 62a4 is connected to the suction portions 62a2 via a suction pipe 62a3. Therefore, the first holding part 62a holds the upper wafer W1 through vacuum suction by the operation of the vacuum pump 62a4. Specifically, the first holding part 62a holds the upper wafer W1 having the bonding surface W1j as a lower surface from the side of the non-bonding surface W1n (upper surface side) by vacuum suction.

The second holding part 62b includes a plurality of suction portions (not visible in FIGS. 6A and 6B) on the side of an upper surface 62b1. A vacuum pump 62b4 is connected to the suction portions via a suction pipe 62b3 (see FIG. 6B). Therefore, the second holding part 62b holds the lower wafer W2 or the like through vacuum suction by the operation of the vacuum pump 62b4.

Specifically, the second holding part 62b holds the lower wafer W2 having the bonding surface W2j as an upper surface through vacuum suction from the side of the non-bonding surface W2n (lower surface side) by allowing the lower wafer W2 to face the upper wafer W1. Although not shown, the second holding part 62b also holds the laminated wafer T by vacuum suction as described above.

In this manner, the first holding part 62a holds the upper wafer W1 by vacuum suction, and the second holding part 62b holds the lower wafer W2 by vacuum suction. Thus, the first and second holding parts 62a and 62b can reliably hold the upper wafer W1 and the lower wafer W2.

The first driving part 64 is connected to the first holding part 62a and the second holding part 62b. The first driving part 64 drives the first holding part 62a and the second holding part 62b together and integrally moves the first holding part 62a and the second holding part 62b in the vertical direction and the horizontal direction and about the vertical axis with respect to a base 65. Although not shown, the first driving part 64 includes a drive source such as a motor or the like and a power transmission mechanism such as a belt or the like.

By configuring the transfer device 61 as described above, it is possible to downsize the transfer device 61. That is to say, for example, if driving parts are respectively connected to the first holding part 62a and the second holding part 62b, the number of driving parts is two and the transfer device 61 is increased in size. However, in the transfer device 61 according to the present embodiment, the first and second holding parts 62a and 62b are driven together by one first driving part 64. This makes it possible to reduce the size of the transfer device 61.

When transferring the upper wafer W1 and the lower wafer W2 to the bonding apparatus 41, the transfer device 61 holds the upper wafer W1 with the first holding part 62a and holds the lower wafer W2 with the second holding part 62b, thereby transferring the upper wafer W1 and the lower wafer W2 together.

More specifically, as shown in FIG. 6B, the first holding part 62a holds the upper wafer W1 having the bonding surface W1j as a lower surface from the upper surface side, and the second holding part 62b holds the lower wafer W2 having the bonding surface W2j as an upper surface from the lower surface side by allowing the lower wafer W2 to face the upper wafer W1.

Thus, in the bonding apparatus 41, the upper wafer W1 and the lower wafer W2 are transferred in the same orientation as that available when performing a bonding process. Therefore, in the bonding apparatus 41, it is not necessary to perform, for example, a process of inverting the orientation of the upper wafer W1. As a result, it is possible to shorten the time required for performing the bonding process in the bonding apparatus 41.

The transfer device 61 further includes a plurality of (four, in this example) position detecting parts 70a to 70d. For example, the position detecting parts 70a to 70d are fixed to the base 65. The position detecting parts 70a to 70d detect the positions of the peripheral edges of the upper wafer W1 and the lower wafer W2 held by the first holding part 62a and the second holding part 62b, at different locations, respectively.

More specifically, each of the position detecting parts 70a to 70d includes a light projecting part 71 and a light receiving part 72. The light projecting part 71 and the light receiving part 72 are disposed at positions where the light projecting part 71 and the light receiving part 72 sandwich the upper wafer W1 and the lower wafer W2 held by the first holding part 62a and the second holding part 62b from above and below. That is, the position detecting parts 70a to 70d are disposed perpendicularly to the surfaces (for example, the bonding surfaces W1j and W2j and the non-bonding surfaces W1n and W2n) of the upper wafer W1 and the lower wafer W2 held by the first holding part 62a and the second holding part 62b The arrangement of the light projecting part 71 and the light receiving part 72 is not limited to the example described above. For example, the light projecting part 71 may be disposed above the upper wafer W1 or the like and the light receiving part 72 may be disposed below the upper wafer W1 or the like. As the light receiving part 72, it may be possible to use a line sensor in which a plurality of light receiving elements is linearly arranged. However, the present disclosure is not limited thereto.

The light receiving part 72 receives the light irradiated from the light projecting part 71 using the light receiving elements. However, when the upper wafer W1 or the like exists between the light projecting part 71 and the light receiving part 72, the light is partially blocked by the upper wafer W1 or the like.

As a result, in the light receiving part 72, a difference occurs in the amount of received light between the light receiving element that receives light and the light receiving element that does not receive light. The position detecting parts 70a to 70d detect the position of the peripheral edge of the upper wafer W1 or the like based on the difference in the amount of received light. The position detecting parts 70a to 70d send a signal indicating the detection result to a control device 100 (see FIG. 1) which will be described later. A process for detecting the position of the peripheral edge of the upper wafer W1 or the like by the position detecting parts 70a to 70d will be described later.

Returning to the description of FIG. 1, the bonding system 1 includes a control device 100. The control device 100 controls the operation of the bonding system 1. The control device 100 is, for example, a computer, and includes a control part and a memory unit (not shown). A program for controlling various processes such as a bonding process and the like, data used in various processes, and the like are stored in the memory part. The control part controls the operation of the bonding system 1 by reading out and executing the program or the like stored in the memory part.

Such a program may be recorded in a computer-readable recording medium and may be installed in the memory part of the control device 100 from the recording medium. Examples of the computer-readable recording medium include a hard disk (HD), a flexible disk (FD), a compact disk (CD), a magneto-optical disk (MO), a memory card, and the like.

Now, the substrate temperature control device 42 will be described in detail with reference to FIG. 7. FIG. 7 is a schematic side view showing the configuration of the substrate temperature control device 42.

The upper wafer W1 having the bonding surface W1j as a lower surface and the lower wafer W2 having the bonding surface W2j as an upper surface are transferred to the substrate temperature control device 42 by the transfer device 61. The substrate temperature control device 42 controls the temperature of each of the upper wafer W1 and the lower wafer. Specifically, as shown in FIG. 7, the substrate temperature control device 42 includes a first temperature control holding plate 42a and a second temperature control holding plate 42b.

The first temperature control holding plate 42a holds the upper wafer W1 before bonding, more specifically, the upper wafer W1 after hydrophilizing and before bonding. Specifically, the first temperature control holding plate 42a is provided with a plurality of holding pins 42a2 on a holding surface 42a1 for holding the upper wafer W1. The holding pins 42a2 are configured to be movable upward and downward with respect to the holding surface 42a1 of the first temperature control holding plate 42a.

A vacuum pump 42a4 is connected to the holding pins 42a2 via a suction pipe 42a3. Therefore, the first temperature control holding plate 42a holds the upper wafer W1 through vacuum suction by the operation of the vacuum pump 42a4. It is assumed that the non-bonding surface Win of the upper wafer W1 is sucked and held by the holding pins 42a2 of the first temperature control holding plate 42a.

Furthermore, a first temperature control mechanism 42a5 is built in the first temperature control holding plate 42a. For example, a temperature-controlled coolant such as cooling water or the like is circulated through the first temperature control mechanism 42a5. Accordingly, the first temperature control holding plate 42a controls the temperature of the upper wafer W1 by adjusting the cooling temperature of the first temperature control mechanism 42a5 or by raising and lowering the holding pins 42a2 to adjust the spaced-apart distance between the holding pins 42a2 and the upper wafer W1.

The second temperature control holding plate 42b is disposed so that the holding surface 42b1 thereof faces the holding surface 42a1 of the first temperature control holding plate 42a. The second temperature control holding plate 42b holds the lower wafer W2 before bonding, specifically the lower wafer W2 after hydrophilizing and before bonding. Specifically, the second temperature control holding plate 42b is provided with a plurality of holding pins 42b2 on a holding surface 42b1 for holding the lower wafer W2. The holding pins 42b2 are configured to be movable upward and downward with respect to the holding surface 42b1 of the second temperature control holding plate 42b.

A vacuum pump 42b4 is connected to the holding pins 42b2 via a suction pipe 42b3. Therefore, the second temperature control holding plate 42b holds the lower wafer W2 through vacuum suction by the operation of the vacuum pump 42b4. It is assumed that the non-bonding surface W2n of the lower wafer W2 is sucked and held by the holding pins 42b2. In the above description, the second temperature control holding plate 42b holds the lower wafer W2 by suction. However, the present disclosure is not limited thereto. For example, the vacuum pump 42b4 and the suction pipe 42b3 may be removed and the lower wafer W2 may be held by mounting.

A second temperature control mechanism 42b5 is built in the second temperature control holding plate 42b. For example, a coolant is circulated through the second temperature control mechanism 42b5. A plurality of proximity pins 42b7 capable of supporting the lower wafer W2 is provided on the holding surface 42b1 of the second temperature control holding plate 42b.

In the second temperature control holding plate 42b configured as above, the transferred lower wafer W2 is held by the holding pins 42b2. Subsequently, the holding pins 42b2 are moved down until the tips of the holding pins 42b2 are positioned lower than the proximity pins 42b7. As a result, the lower wafer W2 is supported by the proximity pins 42b7. An appropriate gap is secured between the lower wafer W2 and the holding surface 42b1 of the second temperature control holding plate 42b. In this manner, the second temperature control holding plate 42b adjusts the temperature of the lower wafer W2 in a state in which an appropriate spaced-apart distance between the second temperature control holding plate 42b and the lower wafer W2 is maintained.

Although the proximity pins 42b7 are used in the second temperature control holding plate 42b, the present disclosure is not limited thereto. For example, the proximity pins 42b7 may be removed and the temperature of the lower wafer W2 may be adjusted by lowering the holding pins 42b2 to a position where the holding pins 42b2 is appropriately spaced apart from the lower wafer W2, and maintaining the holding pins 42b2 at the position.

As the first and second temperature control mechanisms 42a5 and 42b5, it may be possible to use cooling jackets or the like. However, the present disclosure is not limited thereto. For example, other types of temperature control mechanisms such as a heater and the like may be used.

The substrate temperature control device 42 configured as above performs temperature control so that the lower wafer W2 before bonding has a higher temperature than the temperature of the upper wafer W1 before bonding. As a result, it is possible to suppress scaling.

Scaling is a phenomenon that, for example, in the bonded laminated wafer T, a positional deviation occurs in the horizontal direction at the peripheral edges of the upper wafer W1 and the lower wafer W2, even if the central portions of the upper wafer W1 and the lower wafer W2 are aligned with each other. This phenomenon occurs because, as will be described later, when bonding the upper wafer W1 and the lower wafer W2, the central portion W1a of the upper wafer W1 is lowered toward the central portion W2a of the lower wafer W2 by a pushing member 250 (see FIG. 14D), whereby the upper wafer W1 is warped and stretched downward in a convex shape.

Therefore, in the substrate temperature control device 42 according to this embodiment, the temperature control is performed so that the lower wafer W2 before bonding has a higher temperature than the temperature of the upper wafer W1 before bonding, thereby expanding the lower wafer W2. Thus, it is possible to effectively suppress the horizontal positional deviation (scaling) of the peripheral edges of the upper wafer W1 and the lower wafer W2.

In the above description, the substrate temperature control device 42 performs temperature control so that the lower wafer W2 before bonding has a higher temperature than the temperature of the upper wafer W1 before bonding. However, this is illustrative and not limitative. For example, the lower wafer W2 and the upper wafer W1 may have the same temperature.

In the above description, the substrate temperature control device 42 controls the temperatures of both the upper wafer W1 and the lower wafer W2. However, the present disclosure is not limited thereto. The temperature of any one of the upper wafer W1 and the lower wafer W2 may be controlled.

As described above, the substrate temperature control device 42 is disposed on the downstream side of the bonding apparatus 41 in the flow direction of the temperature control air (see FIG. 1). Accordingly, the temperature environments around the substrate temperature control device 42 and the bonding apparatus 41 are similar. Thus, when the upper wafer W1 and the lower wafer W2 whose temperatures have been controlled by the substrate temperature control device 42 are transferred to the bonding apparatus 41, it is possible to limit influences such as a decrease in the wafer temperature due to the surrounding temperature. Consequently, it is possible to easily manage the temperatures of the upper wafer W1 and the lower wafer W2.

<2. Configuration of Bonding Apparatus>

Figure 8:
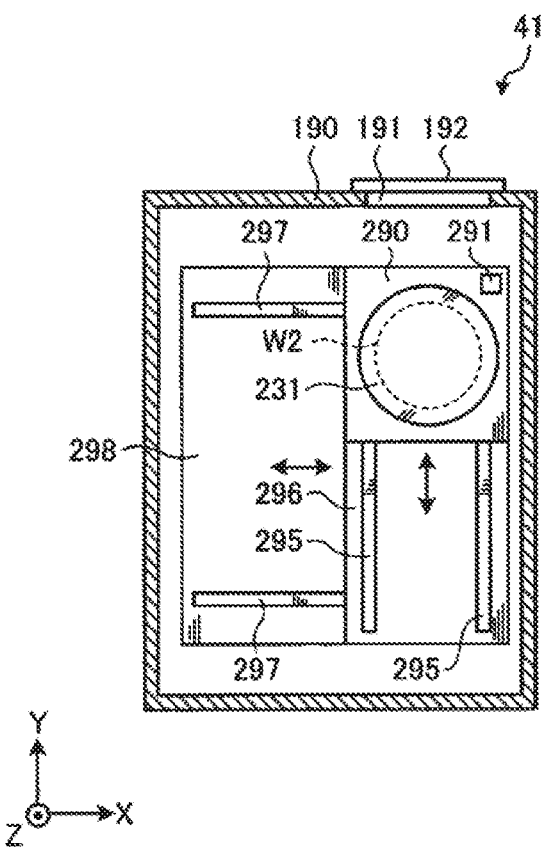
FIG. 8 is a schematic plan view showing a configuration of a bonding apparatus.
Figure 9:
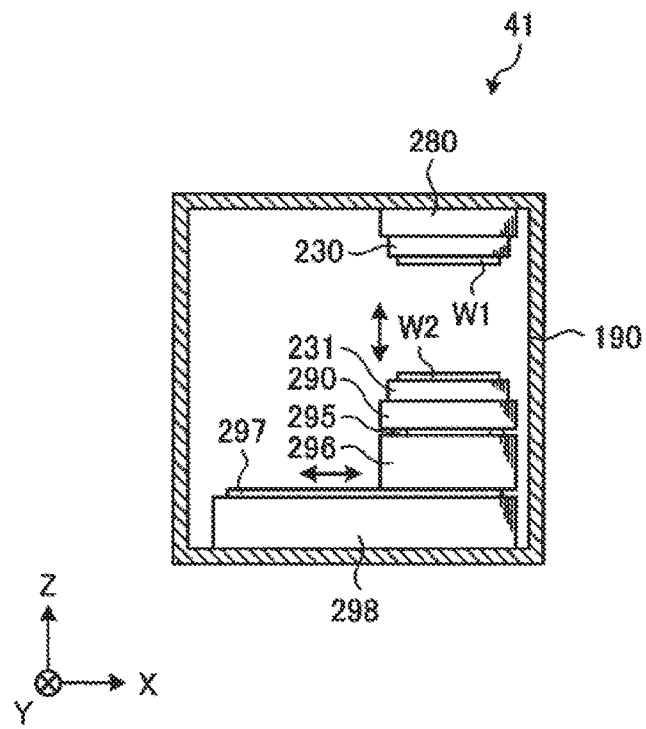
FIG. 9 is a schematic side view showing the configuration of the bonding apparatus.
Figure 10:
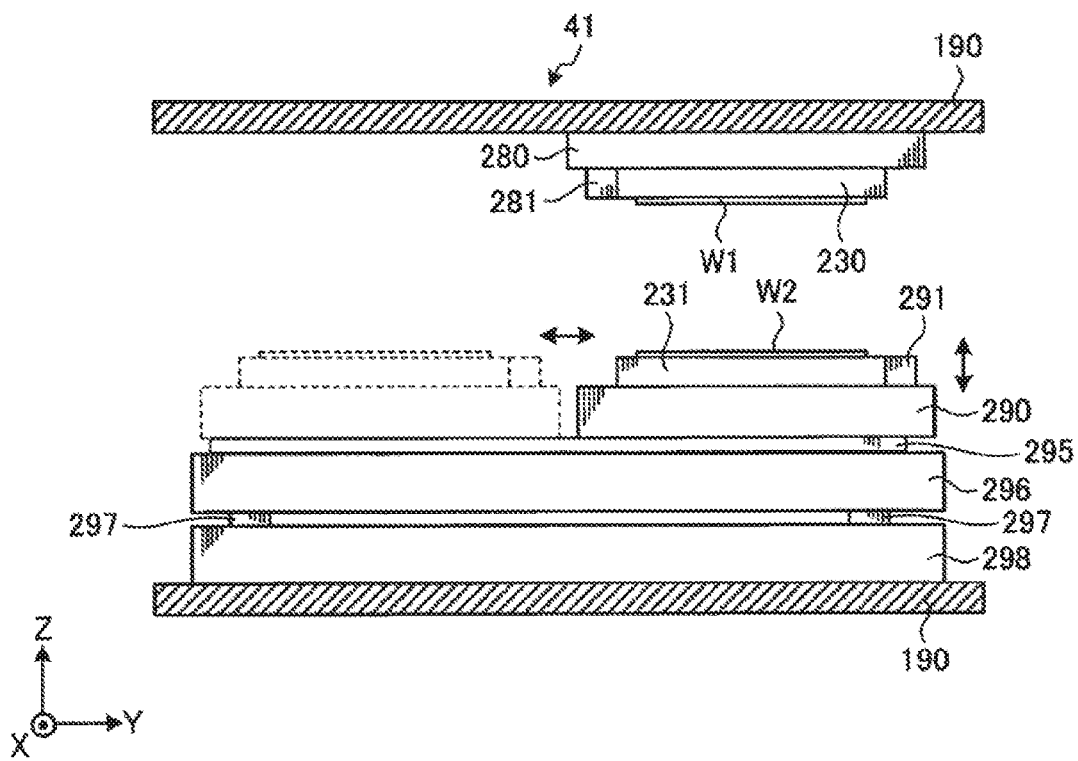
FIG. 10 is a schematic side view showing an internal configuration of the bonding apparatus.

Next, the configuration of the bonding apparatus 41 will be described with reference to FIGS. 8 to 13. FIG. 8 is a schematic plan view showing the configuration of the bonding apparatus 41, and FIG. 9 is a schematic side view thereof. FIG. 10 is a schematic side view showing the internal configuration of the bonding apparatus 41.

As shown in FIG. 8, the bonding apparatus 41 includes a processing container 190 capable of hermetically sealing the interior thereof. A loading/unloading port 191 for the upper wafer W1, the lower wafer W2 and the laminated wafer T is formed on the side surface of the processing container 190 on the side of the transfer region 60. An opening/closing shutter 192 is provided at the loading/unloading port 191.

As shown in FIG. 9, an upper chuck 230 and a lower chuck 231 are provided inside the processing container 190. The upper chuck 230 sucks and holds the upper wafer W1 from above. The lower chuck 231 is provided below the upper chuck 230 to suck and hold the lower wafer W2 from below.

As shown in FIG. 9, the upper chuck 230 is supported by a support member 280 provided on the ceiling surface of the processing container 190.

In the support member 280, an upper imaging part 281 (see FIG. 10) is provided for capturing an image of the bonding surface W2j of the lower wafer W2 held by the lower chuck 231. The upper imaging part 281 is provided adjacent to the upper chuck 230.

As shown in FIGS. 8, 9 and 10, the lower chuck 231 is supported by a first lower chuck moving part 290 provided below the lower chuck 231. The first lower chuck moving part 290 moves the lower chuck 231 in the horizontal direction (Y axis direction) as described later. Furthermore, the first lower chuck moving part 290 is configured to be able to move the lower chuck 231 in the vertical direction and to be able to rotate the lower chuck 231 about the vertical axis.

In the first lower chuck moving part 290, there is provided a lower imaging part 291 for capturing an image of the bonding surface W1j of the upper wafer W1 held by the upper chuck 230. The lower imaging part 291 is provided adjacent to the lower chuck 231.

As shown in FIGS. 8, 9 and 10, the first lower chuck moving part 290 is attached to a pair of rails 295 and 295 provided on the lower surface side of the first lower chuck moving part 290 and extending in the horizontal direction (Y axis direction). The first lower chuck moving part 290 is configured to be movable along the rails 295 and 295.

The rails 295 and 295 are provided in the second lower chuck moving part 296. The second lower chuck moving part 296 is attached to a pair of rails 297 and 297 provided on the lower surface side of the second lower chuck moving part 296 and extending in the horizontal direction (X axis direction). The second lower chuck moving part 296 is configured to be movable along the rails 297 and 297, namely to move the lower chuck 231 in the horizontal direction (X axis direction). The rails 297 and 297 are provided on a mounting table 298 provided on the bottom surface of the processing container 190.

Figure 11:
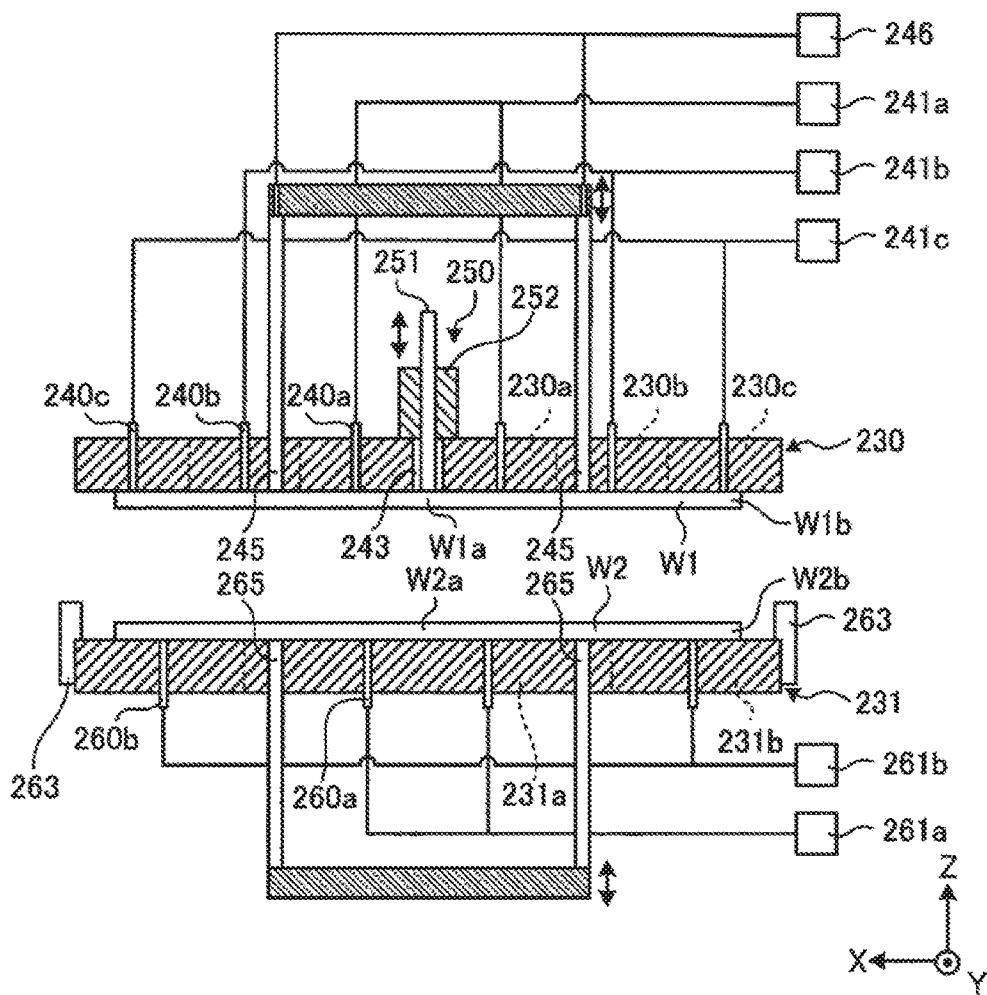
FIG. 11 is a schematic side view showing a configuration of an upper chuck and a lower chuck.
Figure 12:
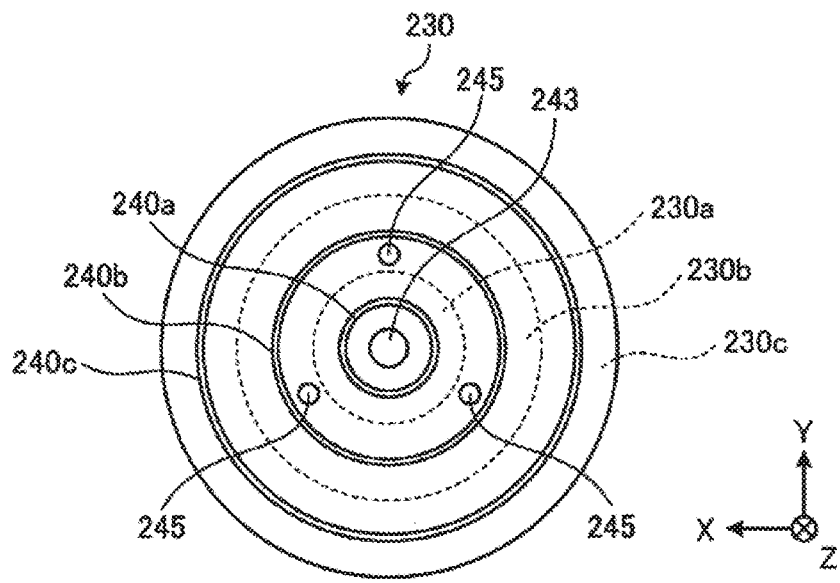
FIG. 12 is a schematic plan view of the upper chuck as viewed from below.
Figure 13:
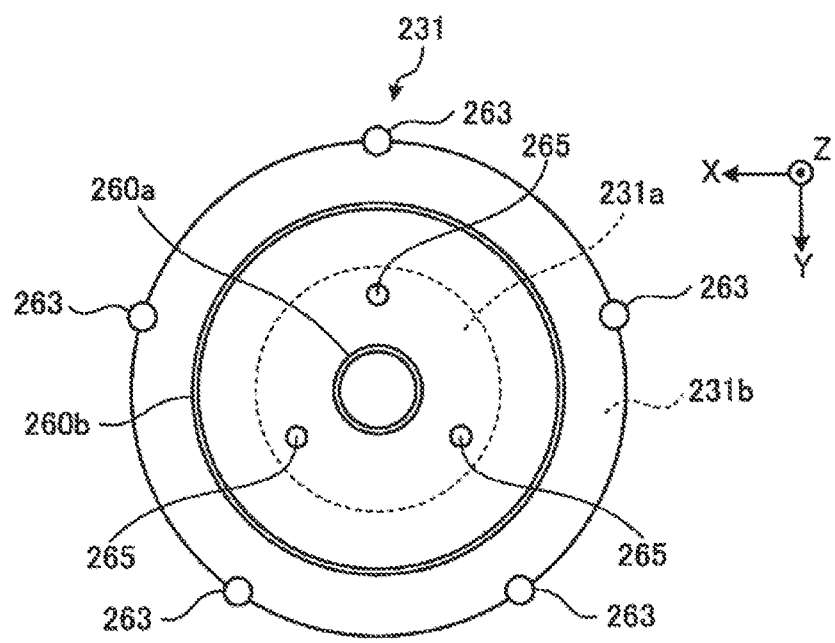
FIG. 13 is a schematic plan view of the lower chuck as viewed from above.

Next, the configurations of the upper chuck 230 and the lower chuck 231 will be described with reference to FIGS. 11 to 13. FIG. 11 is a schematic side view showing the configurations of the upper chuck 230 and the lower chuck 231. FIG. 12 is a schematic plan view of the upper chuck 230 as viewed from below, and FIG. 13 is a schematic plan view of the lower chuck 231 as viewed from above.

As shown in FIG. 11, the upper chuck 230 is partitioned into a plurality of, for example, three regions 230a, 230b and 230c. As shown in FIG. 12, these regions 230a, 230b and 230c are provided in this order from the central portion of the upper chuck 230 toward the peripheral edge portion (outer peripheral portion) thereof. The region 230a has a circular shape in a plan view, and the regions 230b and 230c have an annular shape in a plan view.

As shown in FIG. 11, suction pipes 240a, 240b and 240c for sucking and holding the upper wafer W1 are provided independently in the respective regions 230a, 230b and 230c. Different vacuum pumps 241a, 241b and 241c are connected to the suction pipes 240a, 240b and 240c, respectively. In this manner, the upper chuck 230 is configured so as to be able to set the vacuum drawing of the upper wafer W1 for each of the regions 230a, 230b and 230c.

Further, the upper chuck 230 is provided with a plurality of holding pins 245 that can be moved up and down in the vertical direction. A vacuum pump 246 is connected to the holding pins 245. That is to say, the holding pins 245 can hold the upper wafer W1 through vacuum suction by the operation of the vacuum pump 246.

Accordingly, in the upper chuck 230, for example, the holding pins 245 suck and receive the upper wafer W1 in a state in which the holding pins 245 protrude from the holding surface. Thereafter, the holding pins 245 are moved upward to bring the upper wafer W1 into contact with the holding surface. Subsequently, in the upper chuck 230, the vacuum pumps 241a, 241b and 241c are operated to suck and hold the upper wafer W1 in the regions 230a, 230b and 230c as shown in FIG. 11.

A through-hole 243 penetrating the upper chuck 230 in the thickness direction is formed in the central portion of the upper chuck 230. The central portion of the upper chuck 230 corresponds to the central portion W1a of the upper wafer W1 sucked and held by the upper chuck 230. A pushing pin 251 of a pushing member 250 to be described later is inserted into the through-hole 243.

On the upper surface of the upper chuck 230, a pushing member 250 for pushing the central portion of the upper wafer W1 is provided. The pushing member 250 has a cylinder structure and includes a pushing pin 251 and an outer cylinder 252 serving as a guide when the pushing pin 251 moves up and down. The pushing pin 251 can be vertically moved up and down through the through-hole 243 by, for example, a driving part (not shown) incorporating a motor therein. At the time of bonding the upper wafer W1 and the lower wafer W2 as described later, the pushing member 250 can press the central portion W1a of the upper wafer W1 and the central portion W2a of the lower wafer W2 against each other.

As shown in FIG. 13, the lower chuck 231 is partitioned into a plurality of, for example, two regions 231a and 231b. These regions 231a and 231b are provided in this order from the central portion of the lower chuck 231 toward the peripheral edge portion thereof. The region 231a has a circular shape in a plan view, and the region 231b has an annular shape in a plan view.

As shown in FIG. 11, suction pipes 260a and 260b for sucking and holding the lower wafer W2 are provided independently in the respective regions 231a and 231b. Different vacuum pumps 261a and 261b are connected to the suction pipes 260a and 260b, respectively. As described above, the lower chuck 231 is configured so as to be able to set the vacuum drawing of the lower wafer W2 for each of the regions 231a and 231b.

Further, the lower chuck 231 is provided with a plurality of holding pins 265 capable of moving up and down in the vertical direction. In the lower chuck 231, for example, the holding pins 265 mount and receive the lower wafer W2 in a state in which the holding pins 265 protrude from the holding surface. Thereafter, the holding pins 265 are moved down to bring the lower wafer W2 into contact with the holding surface. Subsequently, in the lower chuck 231, the vacuum pumps 261a and 261b are operated to suck and hold the lower wafer W2 in the respective regions 231a and 231b as shown in FIG. 11. In the above description, the holding pins 265 hold the lower wafer W2 by mounting. However, the present disclosure is not limited thereto. Similar to the holding pins 245 of the upper chuck 230, the holding pins 265 may hold the lower wafer W2 by suction.

In the peripheral edge portion of the lower chuck 231, stopper members 263 for preventing the upper wafer W1, the lower wafer W2 and the laminated wafer T from jumping out or slipping off from the lower chuck 231 are provided at a plurality of locations, for example, at five locations.

<3. Wafer Position Adjusting and Bonding Operation in Bonding Apparatus>

Next, the position adjustment of the upper wafer W1 and the lower wafer W2 and the bonding operation of the upper wafer W1 and the lower wafer W2 in the bonding apparatus 41 configured as above will be specifically described. FIGS. 14A to 14H are operation explanation views of the bonding apparatus 41.

It is assumed that the upper wafer W1 and the lower wafer W2 shown in FIGS. 14A to 14H have undergone the modifying process and the hydrophilizing process on the bonding surfaces W1j and W2j, respectively. In addition, it is assumed that the non-bonding surface W1n of the upper wafer W1 is sucked and held by the upper chuck 230 and the non-bonding surface W2n of the lower wafer W2 is sucked and held by the lower chuck 231.

Then, the upper wafer W1 held by the upper chuck 230 and the lower wafer W2 held by the lower chuck 231 are subjected to horizontal position adjustment.

As shown in FIG. 14A, a predetermined plurality of, for example, three reference points A1 to A3 are formed on the bonding surface W1j of the upper wafer W1. Similarly, a predetermined plurality of, for example, three reference points B1 to B3 are formed on the bonding surface W2j of the lower wafer W2. As the reference points A1 to A3 and B1 to B3, predetermined patterns formed on the upper wafer W1 and the lower wafer W2 are used, respectively. The number of reference points can be arbitrarily set.

First, as shown in FIG. 14A, the horizontal positions of the upper imaging part 281 and the lower imaging part 291 are adjusted. Specifically, the lower chuck 231 is horizontally moved by the first lower chuck moving part 290 and the second lower chuck moving part 296 so that the lower imaging part 291 is positioned substantially below the upper imaging part 281. Then, a common target X is confirmed by the upper imaging part 281 and the lower imaging part 291. The horizontal position of the lower imaging part 291 is finely adjusted so that the horizontal positions of the upper imaging part 281 and the lower imaging part 291 are aligned with each other.

Next, as shown in FIG. 14B, after the lower chuck 231 is moved vertically upward by the first lower chuck moving part 290, the horizontal positions of the upper chuck 230 and the lower chuck 231 are adjusted.

More specifically, while moving the lower chuck 231 in the horizontal direction by the first lower chuck moving part 290 and the second lower chuck moving part 296, the reference points B1 to B3 of the bonding surface W2j of the lower wafer W2 are imaged using the upper imaging part 281. At the same time, while moving the lower chuck 231 in the horizontal direction, the reference points A1 to A3 of the bonding surface W1j of the upper wafer W1 are sequentially imaged using the lower imaging part 291. FIG. 14B shows a state in which the reference point B1 of the lower wafer W2 is imaged by the upper imaging part 281 and the reference point A1 of the upper wafer W1 is imaged by the lower imaging part 291.

The captured image data is outputted to the control device 100. Based on the image data captured by the upper imaging part 281 and the image data captured by the lower imaging part 291, the control device 100 causes the first and second lower chuck moving parts 290 and 296 to adjust the horizontal position of the lower chuck 231 so that the reference points A1 to A3 of the upper wafer W1 and the reference points B1 to B3 of the lower wafer W2 are aligned with each other. Thus, the horizontal positions of the upper chuck 230 and the lower chuck 231 are adjusted, and the horizontal positions of the upper wafer W1 and the lower wafer W2 are adjusted.

Next, as shown in FIG. 14C, the lower chuck 231 is vertically moved upward by the first lower chuck moving part 290, whereby the vertical positions of the upper chuck 230 and the lower chuck 231 are adjusted, and the vertical positions of the upper wafer W1 held by the upper chuck 230 and the lower wafer W2 held by the lower chuck 231 are adjusted. At this time, the gap between the bonding surface W2j of the lower wafer W2 and the bonding surface W1j of the upper wafer W1 is a predetermined distance, for example, 80 μm to 200 μm.

With such a configuration, it is possible to adjust the horizontal positions and the vertical positions of the upper wafer W1 and the lower wafer W2 with high accuracy.

Figure 14D:
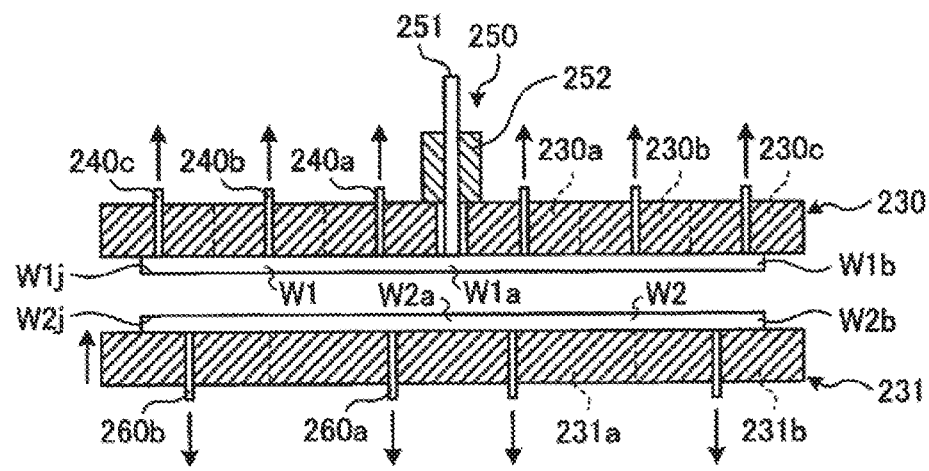
FIG. 14D is an operation explanation view of the bonding apparatus.

FIG. 14D shows the states of the upper chuck 230, the upper wafer W1, the lower chuck 231 and the lower wafer W2 after the adjustment of the horizontal positions and the vertical positions described above is completed. As shown in FIG. 14D, the upper wafer W1 is vacuum-drawn and held in all the regions 230a, 230b and 230c of the upper chuck 230, and the lower wafer W2 is also vacuum-drawn and held in all the regions 231a and 231b of the lower chuck 231.

Figure 14E:
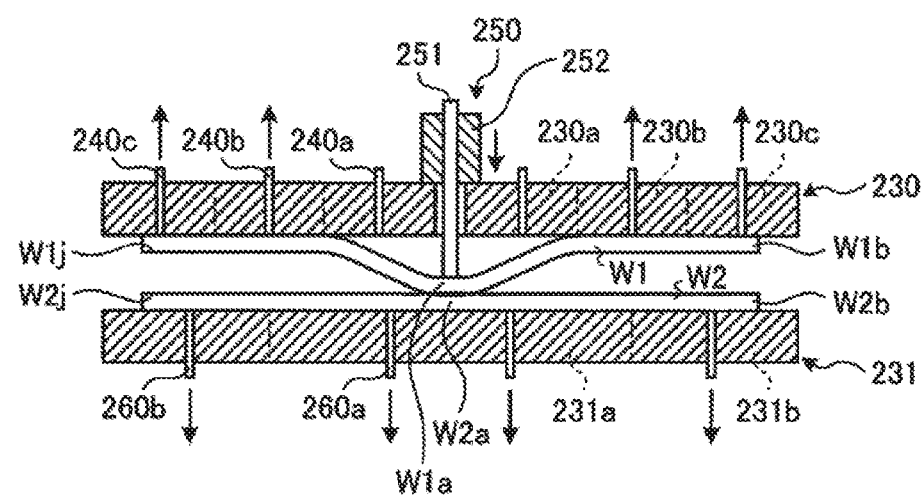
FIG. 14E is an operation explanation view of the bonding apparatus.

Next, a bonding process is performed in which the upper wafer W1 and the lower wafer W2 are bonded by an intermolecular force. Specifically, in the bonding process, the operation of the vacuum pump 241a is stopped, and the vacuum drawing of the upper wafer W1 from the suction pipe 240a in the region 230a is stopped as shown in FIG. 14E. At this time, in the regions 230b and 230c, the upper wafer W1 is vacuum-drawn, sucked and held. Thereafter, by moving down the pushing pin 251 of the pushing member 250, the upper wafer W1 is lowered while pressing the central portion W1a of the upper wafer W1. At this time, a load of, for example, 200 g, is applied to the pushing pin 251 such that the pushing pin 251 moves 70 μm in the absence of the upper wafer W1. Then, the central portion W1a of the upper wafer W1 and the central portion W2a of the lower wafer W2 are brought into contact with each other and pressed against each other by the pushing member 250.

As a result, bonding is started between the central portion W1a of the pressed upper wafer W1 and the central portion W2a of the lower wafer W2 (bold line portion in FIG. 14E). Since the bonding surface W1j of the upper wafer W1 and the bonding surface W2j of the lower wafer W2 are respectively modified, a van der Waals force (intermolecular force) is first generated between the bonding surfaces W1j and W2j. Thus, the bonding surfaces W1j and W2j are bonded together. Furthermore, since the bonding surface W1j of the upper wafer W1 and the bonding surface W2j of the lower wafer W2 are made hydrophilic, the hydrophilic groups between the bonding surfaces W1j and W2j are hydrogen-bonded. Thus, the bonding surfaces W1j and W2j are strongly bonded together.

Figure 14F:
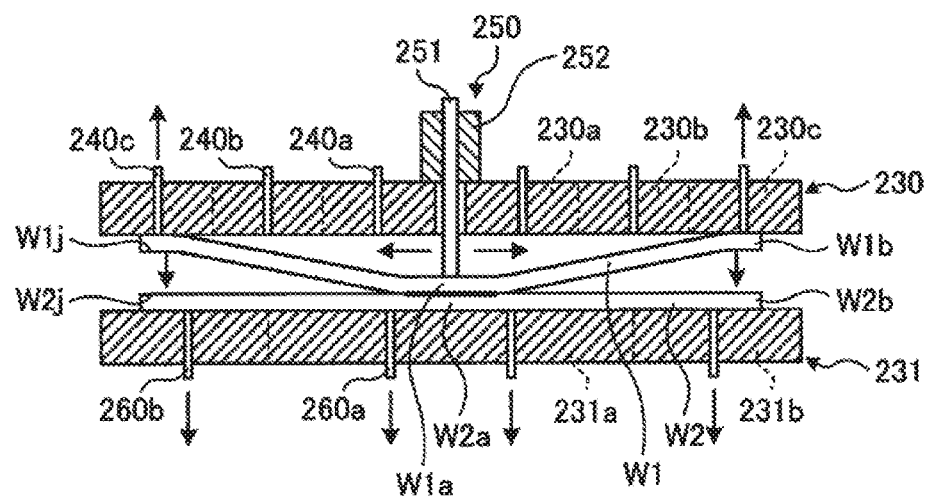
FIG. 14F is an operation explanation view of the bonding apparatus.

Thereafter, as shown in FIG. 14F, the operation of the vacuum pump 241b is stopped in a state in which the central portion W1a of the upper wafer W1 and the central portion W2a of the lower wafer W2 are pressed by the pushing member 250, whereby the vacuum drawing of the upper wafer W1 from the suction pipe 240b in the region 230b is stopped.

As a result, the upper wafer W1 held in the region 230b drops onto the lower wafer W2. Thereafter, the operation of the vacuum pump 241c is stopped, whereby the vacuum drawing of the upper wafer W1 from the suction pipe 240c in the region 230c is stopped. In this way, the vacuum drawing of the upper wafer W1 is stopped stepwise from the central portion W1a of the upper wafer W1 toward the peripheral edge portion W1b. Thus, the upper wafer W1 drops down and comes into contact with the lower wafer W2 in a stepwise manner. The aforementioned bonding due to the van der Waals force and the hydrogen bond between the bonding surfaces W1j and W2j is sequentially spread from the central portion W1a toward the peripheral edge portion W1b.

Figure 14G:
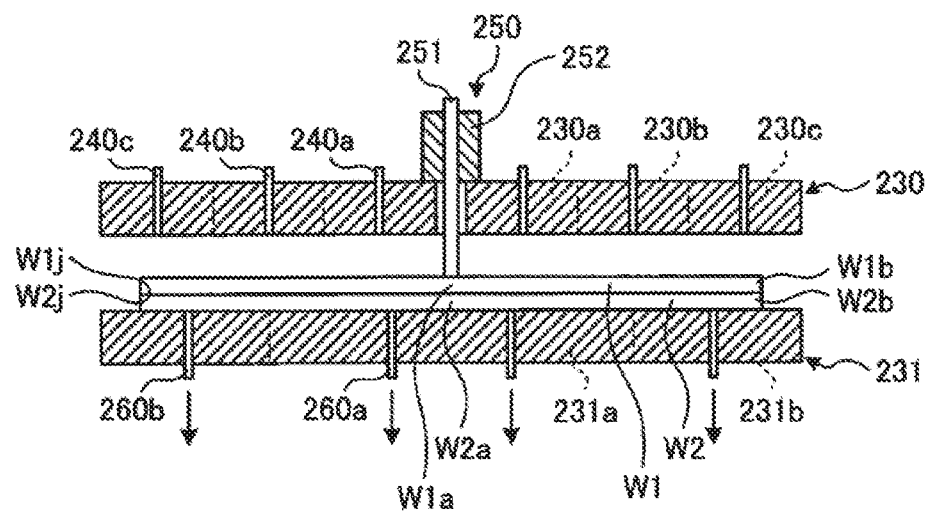
FIG. 14G is an operation explanation view of the bonding apparatus.

In this way, as shown in FIG. 14G, the bonding surface W1j of the upper wafer W1 and the bonding surface W2j of the lower wafer W2 make contact with each other over each of the surfaces in their entirety, whereby the upper wafer W1 and the lower wafer W2 are bonded together.

Figure 14H:
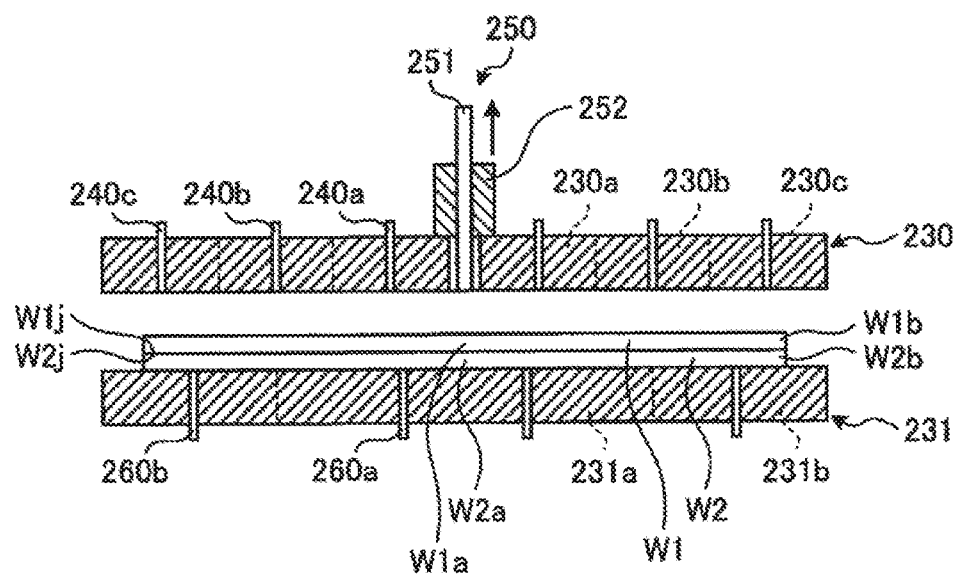
FIG. 14H is an operation explanation view of the bonding apparatus.

Thereafter, as shown in FIG. 14H, the pushing member 250 is moved up to the upper chuck 230. Further, in the lower chuck 231, the vacuum drawing of the lower wafer W2 from the suction pipes 260a and 260b is stopped, whereby the suction holding of the lower wafer W2 by the lower chuck 231 is canceled. As a result, the bonding process in the bonding apparatus 41 is completed.

<4. Specific Operation of Bonding System (Normal Mode)>

Next, a specific operation of the bonding system 1 configured as above will be described with reference to FIG. 15. FIG. 15 is a flowchart showing a part of the processing procedure of the processes executed by the bonding system 1. The various processes shown in FIG. 15 are executed under the control of the control device 100. The processes shown in FIG. 15 are processes in a "normal mode" in which a normal bonding process is performed in the bonding apparatus 41 of the bonding system 1.

First, a cassette C1 accommodating a plurality of upper wafers W1, a cassette C2 accommodating a plurality of lower wafers W2, and an empty cassette C3 are mounted on the predetermined mounting plates 11 of the loading/unloading station 2. Thereafter, the upper wafer W1 in the cassette C1 is taken out by the transfer device 22 and is transferred to the transition 53 of the third processing block G3 of the processing station 3.

Next, the upper wafer W1 is transferred to the load lock chamber 31 of the first processing block G1 by the transfer device 61 and is mounted on the transition 31a1, whereby the delivery of the upper wafer W1 is performed (step S101). Next, after the gate valve 36a is closed, the vacuum pump 31c is operated, whereby the load lock chamber 31 is depressurized into a depressurized atmosphere (step S102).

Next, the upper wafer W1 is transferred from the load lock chamber 31 to the surface modifying apparatus 33 by the modifying transfer device 32a of the transfer chamber 32. In the surface modifying apparatus 33, an oxygen gas as a process gas is excited into plasma and ionized under a depressurized atmosphere. The oxygen ions are irradiated onto the bonding surface W1j of the upper wafer W1, whereby the bonding surface W1j is plasma-processed. As a result, the bonding surface W1j of the upper wafer W1 is modified (step S103).

Next, the upper wafer W1 is transferred from the surface modifying apparatus 33 to the load lock chamber 31 by the modifying transfer device 32a and is mounted on the transition 31a2. Then, the load lock chamber 31 is switched from the depressurized atmosphere to an atmospheric pressure atmosphere by opening the gate valve 36a, and the upper wafer W1 is delivered (step S104). As described above, the load lock chamber 31 is set to an atmospheric pressure atmosphere. However, the transfer chamber 32 and the surface modifying apparatus 33 are kept in the depressurized atmosphere.

Next, the upper wafer W1 is transferred from the load lock chamber 31 to the surface hydrophilizing apparatus 34 by the transfer device 61. In the surface hydrophilizing apparatus 34, while rotating the upper wafer W1 held by the spin chuck, pure water is supplied onto the upper wafer W1. Then, the supplied pure water diffuses on the bonding surface W1j of the upper wafer W1. A hydroxyl group (silanol group) adheres to the bonding surface W1j of the upper wafer W1 modified in the surface modifying apparatus 33, whereby the bonding surface W1j is rendered hydrophilic. In addition, the bonding surface W1j of the upper wafer W1 is cleaned with the pure water (step S105).

Next, the hydrophilized upper wafer W1 is transferred to the position adjusting device 51 by the transfer device 61. Then, the horizontal orientation of the upper wafer is adjusted by the position adjusting device 51 (step S106).

Thereafter, the front and back surfaces of the upper wafer W1 are inverted by the base inverting part 51d of the position adjusting device 51, whereby the bonding surface W1j serves as a lower surface (step S107). Next, the upper wafer W1 having the bonding surface W1j as a lower surface is transferred to the substrate temperature control device 42 by the transfer device 61. The upper wafer W1 is sucked and held by the first temperature control holding plate 42a of the substrate temperature control device 42. As a result, the temperature of the upper wafer W1 is controlled (step S108).

The above-described processes of steps S101 to S106 and S108 are also performed with respect to the lower wafer W2. First, the lower wafer W2 in the cassette C2 is taken out by the transfer device 22 and is transferred to the transition 54 of the processing station 3.

Next, the lower wafer W2 is transferred to the load lock chamber 31 by the transfer device 61, whereby the delivery of the lower wafer W2 is performed (step S109). Subsequently, the load lock chamber 31 is depressurized into a depressurized atmosphere (step S110).

Next, the lower wafer W2 is transferred from the load lock chamber 31 to the surface modifying apparatus 33 by the modifying transfer device 32a, and the bonding surface W2j is reformed (step S111). Then, the lower wafer W2 is transferred from the surface modifying apparatus 33 to the load lock chamber 31 by the modifying transfer device 32a. The load lock chamber 31 is switched from the depressurized atmosphere to the atmospheric pressure atmosphere, and the delivery of the lower wafer W2 is performed (step S112).

Next, the lower wafer W2 is transferred from the load lock chamber 31 to the surface hydrophilizing apparatus 34 by the transfer device 61. The bonding surface W2j is made hydrophilic and is cleaned (step S113).

Next, the hydrophilized lower wafer W2 is transferred to the position adjusting device 51 by the transfer device 61, and the horizontal orientation of the lower wafer W2 is adjusted (step S114). At this time, the lower wafer W2 is in a state in which the bonding surface W2j serves as an upper surface.

Next, the lower wafer W2 having the bonding surface W2j as an upper surface is transferred to the substrate temperature control device 42. The lower wafer W2 is sucked and held by the second temperature control holding plate 42b, and the temperature of the lower wafer W2 is controlled (step S115). In the substrate temperature control device 42, for example, the lower wafer W2 is controlled to have a higher temperature than the upper wafer W1.

In the above-described steps S101 to S106 and S109 to S115, the transfer of the upper wafer W1 and the lower wafer W2 by the transfer device 61 is performed by the second holding part 62b. In the steps S107 and S108, the transfer of the upper wafer W1, inverted so that the bonding surface W1j serves as a lower surface, is performed by the first holding part 62a. However, the present disclosure is not limited to thereto.

Subsequently, in the bonding system 1, both of the upper wafer W1 and the lower wafer W2 are transferred to the bonding apparatus 41 by the transfer device 61. The upper wafer W1 is delivered to the upper chuck 230 of the bonding apparatus 41, and the lower wafer W2 is delivered to the lower chuck 231 of the bonding apparatus 41. At this time, in order to deliver the upper wafer W1 and the lower wafer W2 to the upper chuck 230 and the lower chuck 231 at appropriate positions, the control device 100 causes the position detecting parts 70a to 70d to detect the positions of the upper wafer W1 and lower wafer W2 held as above.

However, as described above, the position detecting parts 70a to 70d are arranged in a direction perpendicular to the surfaces of the upper wafer W1 and lower wafer W2. Therefore, for example, when the upper wafer W1 and the lower wafer W2 are held in a stacked state, it is difficult to determine whether the position of the detected peripheral edge is the position of the upper wafer W1 or the position of the lower wafer W2.

Therefore, in the present embodiment, when transferring the upper wafer W1 and the lower wafer W2 to the bonding apparatus 41 by the transfer device 61, the position detection is performed when one of the upper wafer W1 and the lower wafer W2 is held. Accordingly, the control device 100 can accurately detect the positions of the peripheral edges of the upper wafer W1 and the lower wafer W2 held by the transfer device 61 and can deliver the upper wafer W1 and the lower wafer W2 to the upper chuck 230 and the lower chuck 231 at appropriate positions.

More specifically, the transfer device 61 initially receives the upper wafer W1 sucked and held by the first temperature control holding plate 42a, using the first holding part 62a (step S116). At this time, the transfer device 61 holds one upper wafer W1. Thus, the position detecting parts 70a to 70d detect the position of the peripheral edge of the upper wafer W1. As a result, the control device 100 can detect the position of the held upper wafer W1 based on the detected position of the peripheral edge of the upper wafer W1.

Subsequently, the transfer device 61 receives the lower wafer W2 sucked and held by the second temperature control holding plate 42b, using the second holding part 62b (step S117). Next, the transfer device 61 transfers the upper wafer W1 and the lower wafer W2 to the bonding apparatus 41 (step S118).

Next, the first holding part 62a moves the upper wafer W1 to an appropriate position below the upper chuck 230 based on the position of the upper wafer W1 detected earlier. Then, the upper wafer W1 is sucked and held by the upper chuck 230 (step S119).

In this regard, the transfer device 61 holds one lower wafer W2. Thus, the position detecting parts 70a to 70d detect the position of the peripheral edge of the lower wafer W2. As a result, the control device 100 can detect the position of the held lower wafer W based on the detected position of the peripheral edge of the lower wafer W2.

Next, the second holding part 62*b* moves the lower wafer W2 to an appropriate position above the lower chuck 231 based on the detected position of the lower wafer W2 and causes the lower wafer W2 to be sucked and held by the lower chuck 231 (step S120).

As described above, in this embodiment, the position of the peripheral edge is detected at the timing when the transfer device 61 holds one of the upper wafer W1 and the lower wafer W2. In the above description, the position is detected in the order of the upper wafer W1 and the lower wafer W2. However, this is illustrative and not limitative. For example, the processes of step S116 and step S117 may be interchanged and the processes of step S119 and step S120 may be interchanged so that the position is detected in the order of the lower wafer W2 and the upper wafer W1.

Subsequently, in the bonding apparatus 41, the horizontal position adjustment of the upper wafer W1 held by the upper chuck 230 and the lower wafer W2 held by the lower chuck 231 is performed (step S121). Next, the vertical position adjustment of the upper wafer W1 held by the upper chuck 230 and the lower wafer W2 held by the lower chuck 231 is performed (step S122).

Next, the central portion W1*a* of the upper wafer W1 and the central portion W2*a* of the lower wafer W2 are brought into contact with each other and pressed against each other by the pushing member 250 (step S123). Then, the upper wafer W1 and the lower wafer W2 are bonded by an intermolecular force (step S124).

The laminated wafer T in which the upper wafer W1 and the lower wafer W2 are bonded is transferred to the transition 54 by the second holding part 62*b* of the transfer device 61 (step S125). Thereafter, the laminated wafer T is transferred to the cassette C3 on a predetermined mounting plate 11 by the transfer device 22 of the loading/unloading station 2. Thus, a series of processes is completed.

<5. Specific Operation of Bonding System (Test Mode)>

Next, a test mode will be described. In addition to the "normal mode" described above, the bonding system 1 according to this embodiment has a "test mode" for checking the transfer state of the upper wafer W1 or the lower wafer W2 in the bonding system 1.

In the test mode, the modifying process and the bonding process are not actually performed in the surface modifying apparatus 33 and the bonding apparatus 41. Therefore, for example, the upper wafer W1 or the lower wafer W2 taken out from the cassette C1 or C2 is transferred to the bonding apparatus 41 and then returned to the cassette C1 or C2 without being bonded.

Hereinafter, the processes in the test mode performed in the bonding system 1 will be described in detail with reference to FIG. 16. FIG. 16 is a flowchart showing a part of the processing procedure of the processes performed by the bonding system 1 in the test mode. A description of the same processes as in the normal mode will be omitted.

As shown in FIG. 16, the upper wafer W1 is transferred from the load lock chamber 31 to the surface modifying apparatus 33 through the processes of steps S101 and S102 (step S103*a*). In the surface modifying apparatus 33, the actual modifying process is not performed.

Subsequently, the upper wafer W1 is transferred to the surface hydrophilizing apparatus 34 by the transfer device 61 (step S105*a*). In the surface hydrophilizing apparatus 34, the hydrophilizing process is not performed. After the horizontal orientation of the upper wafer W1 is adjusted in step S106, the front and rear surfaces of the upper wafer W1 are inverted by the base inverting part 51*d* of the position adjusting device 51. Thus, the upper wafer W1 comes into a state in which the bonding surface W j serves as a lower surface (step S107).

On the other hand, the lower wafer W2 is also transferred to the surface modifying apparatus 33 by the transfer device 61 (step S111*a*) and is then transferred to the surface hydrophilizing apparatus 34 (step S113*a*). However, the modifying process or the hydrophilizing process is not performed in the surface modifying apparatus 33 or the surface hydrophilizing apparatus 34.

Thereafter, the upper wafer W1 and the lower wafer W2 are transferred from the substrate temperature control device 42 to the bonding apparatus 41 (step S118). Through the processes from step S119 to S122, the upper wafer W1 is sucked and held by the upper chuck 230 with the bonding surface W1*j* thereof serving as a lower surface, and the lower wafer W2 is sucked and held by the lower chuck 231 with the bonding surface W2*j* thereof serving as an upper surface (see FIG. 14D).

In the test mode, the bonding process is not performed. Then, the upper wafer W1 and the lower wafer W2 are transferred from the bonding apparatus 41 (step S130). In the process of step S130, for example, as shown in FIG. 6B, the upper wafer W1 is sucked and held by the first holding part 62*a* with the bonding surface W1*j* thereof serving as a lower surface, and the lower wafer W2 is sucked, held and transferred by the second holding part 62*b* with the bonding surface W2*j* thereof serving as an upper surface.

In the cassette C accommodating the upper wafers W1, as described above, the upper wafers W1 are accommodated in a state in which the orientations thereof are aligned with each other with the bonding surfaces W1*j* thereof serving as upper surfaces. Therefore, the front and back surfaces of the upper wafer W1 having the bonding surface W1*j* as a lower surface are inverted by the inverting transition 55 of the third processing block G3 (step S131).

Specifically, as shown in FIG. 5B, the upper wafer W1 transferred from the bonding apparatus 41 in the test mode is held by the suction portion 56*a*2 of the inverting transition 55. Subsequently, the front and back surfaces of the upper wafer W1 are inverted by inverting the holding part 56 with the inverting mechanism 57. Thereafter, as indicated by an imaginary line in FIG. 5B, the upper wafer W1 is brought into a state in which the bonding surface W1*j* serves as an upper surface as is the case when the upper wafer W1 is accommodated in the cassette C1. Then, the upper wafer W1 is transferred to the cassette C1 by the transfer device 22 and is accommodated therein as it is.

In this manner, in the inverting transition 55, it is possible to easily invert the front and back surfaces of the upper wafer W1 whose bonding surface W1*j* serves as a lower surface in the test mode.

The holding part 56 is configured to be able to hold the upper wafer W1 or the like on the upper surface 56*b*1 and the lower surface 56*a*1 thereof. Therefore, as shown in FIG. 5B, when the holding part 56 is inverted in a state in which the upper wafer W1 is sucked by the suction portion 56*a*2 of the lower surface 56*a*1, the suction portion 56*b*2 of the upper surface 56*b*1 faces downward. As a result, in the inverting transition 55, it is possible to prepare to receive the upper wafer W1 returned next time. This makes it possible to shorten the processing time in the bonding system 1.

Since the lower wafer W2 is in a state in which the bonding surface W2*j* serves as an upper surface, the lower wafer W2 is transferred to the transition 54 of the third processing block G3 by the second holding part 62*b* and is then returned to the cassette C2 by the transfer device 22, whereby the test mode is completed.

As described above, the bonding system 1 according to the first embodiment includes the transfer device 61 (an example of a substrate transfer device), the surface modifying apparatus 33, the load lock chamber 31, the surface hydrophilizing apparatus 34, and the bonding apparatus 41. The transfer device 61 transfers the upper wafer W1 (an example of a first substrate) and the lower wafer W2 (an example of a second substrate) in the normal pressure atmosphere. The surface modifying apparatus 33 modifies the bonding surfaces W1j and W2j of the upper wafer W and the lower wafer W2 in the depressurized atmosphere. In the load lock chamber 31, the upper wafer W1 and the lower wafer W2 can be delivered between the transfer device 61 and the surface modifying apparatus 33, and the atmosphere in the chamber can be switched between the atmospheric pressure atmosphere and the depressurized atmosphere. The surface hydrophilizing apparatus 34 hydrophilizes the modified bonding surfaces W1j and W2j of the upper wafer W1 and lower wafer W2. The bonding apparatus 41 bonds the hydrophilized upper wafer W1 and the hydrophilized lower wafer W2 by an intermolecular force. Thus, in the bonding system 1, it is possible to shorten the processing time of the upper wafer W1 and the lower wafer W2.

The transfer device 61 transfers the upper wafer W1 and the lower wafer W2 to the bonding apparatus 41 for bonding the upper wafer W1 and the lower wafer W2. The transfer device 61 includes the first holding part 62a and the second holding part 62b. The first holding part 62a holds the upper wafer W1 having the bonding surface W1j as a lower surface from the upper surface side. The second holding part 62b is provided below the first holding part 62a and is configured to hold the lower wafer W2 having the bonding surface W2j as an upper surface from the lower surface side so that the lower wafer W2 faces the upper wafer W1. As a result, it is possible to shorten the wafer bonding time in the bonding apparatus 41.

(Modification)

Next, a bonding system 1 according to a modification will be described. In the first embodiment described above, when detecting the positions of the upper wafer W1 and the lower wafer W2 held by the transfer device 61, the position detection is performed when one of the upper and lower wafers W1 and W2 is held.

Figure 17A:
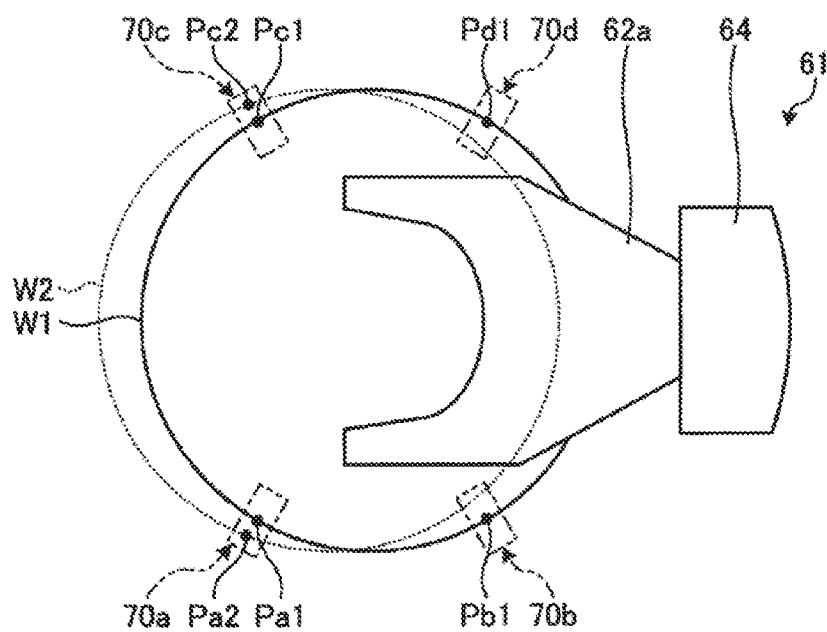
FIG. 17A is a view for explaining position detection of peripheral edges of upper and lower wafers in a modification.
Figure 17B:
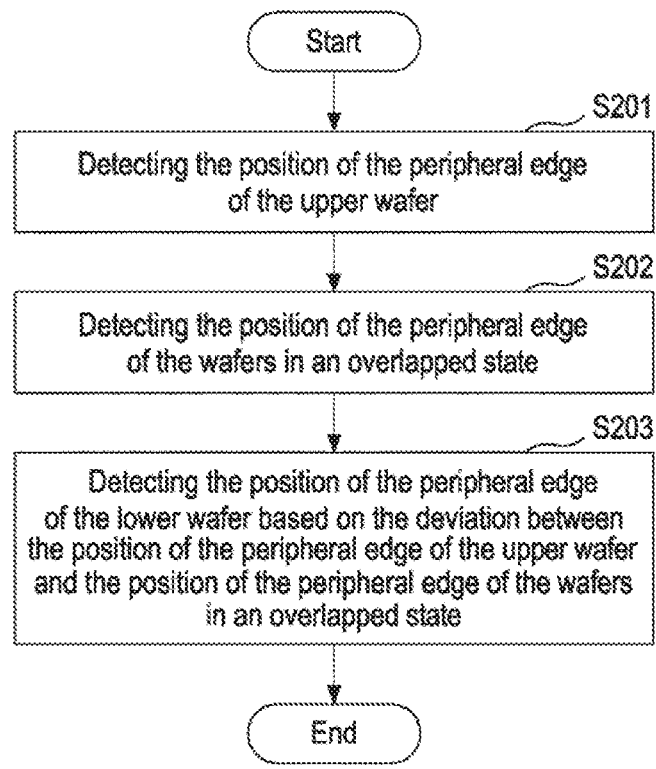
FIG. 17B is a flowchart showing an example of a position detection process in a modification.

In the modification, the position detection is performed at a different time from that in the first embodiment. FIG. 17A is a view for explaining the detection of the positions of the peripheral edges of the upper and lower wafers W1 and W2 in the modification, and FIG. 17B is a flowchart showing an example of the position detection process in the modification. FIG. 17A is a schematic plan view of the transfer device 61. In the following description, an example in which the upper wafer W1 is held by the transfer device 61 and then the lower wafer W2 is held by the transfer device 61 will be described. However, the present disclosure is not limited thereto.

First, for example, the transfer device 61 receives the upper wafer W1 sucked and held by the first temperature control holding plate 42a, using the first holding part 62a (see step S116 in FIG. 15). In FIG. 17A, the upper wafer W1 held by the first holding part 62a is indicated by a solid line.

Then, the position detecting parts 70a to 70d detect the position of the peripheral edge of the upper wafer W and, more precisely, detect the position of the peripheral edge of the upper wafer W before the lower wafer W2 is held (see step S201 in FIG. 17B). In FIG. 17A, the position of the peripheral edge of the upper wafer W1 detected by the position detecting parts 70a to 70d is indicated by points Pa1 to Pd1, respectively.

Subsequently, the transfer device 61 receives the lower wafer W2 sucked and held by the second temperature control holding plate 42b, using the second holding part 62b (see step S117 in FIG. 15).

Then, the position detecting parts 70a to 70d detect the position of the peripheral edge of the two wafers in an overlapped state (step S202 in FIG. 17B). It is assumed that, as shown in FIG. 17A, the lower wafer W2 is held by the second holding part 62b in a state in which the lower wafer W2 is shifted leftward on the drawing sheet with respect to the upper wafer W1.

In such a case, the position of the peripheral edge of the two wafers in the overlapped state, which are detected by the position detecting parts 70a to 70d, is indicated by points Pa2, Pb1, Pc2 and Pd1.

That is, in the illustrated example, the lower wafer W2 is held in a state in which the lower wafer W2 is shifted leftward on the drawing sheet with respect to the upper wafer W1. Therefore, the position of the peripheral edge detected by the position detecting parts 70b and 70d existing on the right side of the drawing sheet is indicated by points Pb1 and Pd1 as is the case when the position of the peripheral edge of the upper wafer W1 is detected.

On the other hand, the position of the peripheral edge detected by the position detecting parts 70a and 70c existing on the left side of the drawing sheet is indicated by points Pa2 and Pc2 which are different from the points Pa1 and Pc1 available when the position of the peripheral edge of the upper wafer W1 is detected.

Therefore, in the modification, the first detection result and the second detection result are compared with each other, and the newly detected position of the peripheral edge (in this case, the points Pa2 and Pc2) is detected as the position of the peripheral edge of the lower wafer W2 held subsequently. In other words, the position detecting parts 70a to 70d detect the position of the peripheral edge of the lower wafer W2 based on the deviation between the detected position of the peripheral edge of the upper wafer W1 and the detected position of the peripheral edge of the two overlapped wafers (step S203).

In the control device 100, only the position of the peripheral edge at the points Pa2 and Pc2 is acquired with respect to the lower wafer W2. Thus, the control device 100 detects the position of the held lower wafer W2 on the basis of the information on the position of the peripheral edge and the radius of the lower wafer W2 already detected. In this manner, the control device 100 can accurately detect the position of the held lower wafer W2. Consequently, it is possible to deliver the lower wafer W2 to the lower chuck 231 of the bonding apparatus 41 at an appropriate position.

As described above, in the position detecting parts 70a to 70d according to the modification, when the upper wafer W1 (an example of "one substrate") of the upper wafer W1 and the lower wafer W2 is held and then the lower wafer W2 (an example of "the other substrate") is held in a state in which the lower wafer W2 overlaps with the upper wafer W1 in a plan view, the position of the peripheral edge of the upper wafer W1 is detected before the lower wafer W2 is held. Subsequently, after the lower wafer W2 is held, the position detecting parts 70a to 70d detect the position of the peripheral edge of the two wafers in an overlapped state, and detect the position of the peripheral edge of the lower wafer W2 on the basis of the deviation between the detected position of the peripheral edge of the upper wafer W1 and the detected position of the peripheral edge of the two wafers in an overlapped state.

As a result, the position detecting parts 70a to 70d can detect the positions of the peripheral edges of the upper and lower wafers W1 and W2 at a time other than when the upper and lower wafers W1 and W2 are held one at a time.

Second Embodiment

Figure 18:
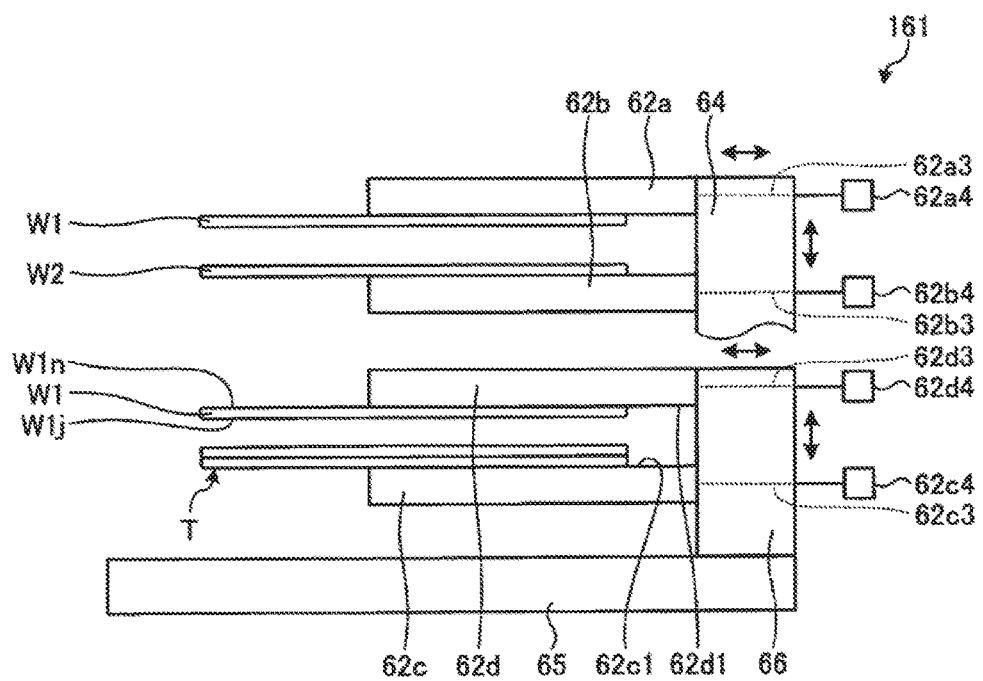
FIG. 18 is a schematic side view showing a configuration of a transfer device according to a second embodiment.

Next, a bonding system 1 according to a second embodiment will be described. FIG. 18 is a schematic side view showing a configuration of a transfer device 161 according to a second embodiment. In the following description, the configurations common to those of the first embodiment will be designated by like reference numerals and the description thereof will be omitted.

The transfer device 61 of the first embodiment is configured to include the first and second holding parts 62a and 62b. On the other hand, as shown in FIG. 18, the transfer device 161 of the second embodiment further includes a third holding part 62c, a fourth holding part 62d, and a second driving part 66.

The third and fourth holding parts 62c and 62d have the same structure as the first and second holding parts 62a and 62b. Specifically, the third holding part 62c is provided with a plurality of suction portions (not visible in FIG. 18) on the side of an upper surface 62c1. A vacuum pump 62c4 is connected to the suction portions via a suction pipe 62c3. Accordingly, the third holding part 62c holds, for example, the laminated wafer T or the like through vacuum suction by the operation of the vacuum pump 62c4.

What is held by the third holding part 62c is not limited to the laminated wafer T but may be, for example, the lower wafer W2 not bonded in the bonding apparatus 41 in the test mode, or the upper wafer W1 not bonded.

The fourth holding part 62d is disposed above the third holding part 62c so as to face the third holding part 62c. The fourth holding part 62d is provided with a plurality of suction portions (not visible in FIG. 18) on the side of a lower surface 62d1. A vacuum pump 62d4 is connected to the suction portions via a suction pipe 62d3. Therefore, the fourth holding part 62d holds the upper wafer W1 having the bonding surface W1j as a lower surface (for example, the upper wafer W1 not bonded in the bonding apparatus 41 in the test mode) through vacuum suction by the operation of the vacuum pump 62d4.

What is held by the fourth holding part 62d is not limited to the upper wafer W1 but may be, for example, the lower wafer W2 not bonded in the bonding apparatus 41 in the test mode, or the laminated wafer T.

In this manner, the third holding part 62c and the fourth holding part 62d are configured to hold at least one of the laminated wafer T, the upper wafer W1 and the lower wafer W2 not bonded by the bonding apparatus 41.

The second driving part 66 is connected to the third holding part 62c and the fourth holding part 62d. The second driving part 66 drives both the third holding part 62c and the fourth holding part 62d to integrally move them in the vertical direction and the horizontal direction and about the vertical axis with respect to the base 65. Although not shown, the second driving part 66 includes a drive source such as a motor or the like and a power transmission mechanism such as a belt or the like.

In this way, the third and fourth holding parts 62c and 62d are driven by the second driving part 66 which is different from the first driving part 64 for driving the first and second holding parts 62a and 62b. Therefore, the third and fourth holding parts 62c and 62d are driven independently of the first and second holding parts 62a and 62b.

Thus, in the transfer device 61 according to the second embodiment, for example, in the normal mode, the first and second holding parts 62a and 62b may perform the process of delivering the upper wafer W1 and the lower wafer W2 to the bonding apparatus 41, and the third and fourth holding parts 62c and 62d may perform the process of taking out the laminated wafer T bonded in the preceding bonding process from the bonding apparatus 41.

That is to say, in the second embodiment, it is possible to perform the process of delivering the upper wafer W1 or the like and the process of taking out the laminated wafer T, at the same time or consecutively. This makes it possible to shorten the processing time of the bonding system 1.

Furthermore, in the transfer device 61 according to the second embodiment, for example, even in the test mode, the first and second holding parts 62a and 62b may perform the process of delivering the upper wafer W1 and the lower wafer W2 to the bonding apparatus 41, and the third and fourth holding parts 62c and 62d may perform the process of taking out the upper wafer W1 and the lower wafer W2 transferred to the bonding apparatus 41 in the preceding process and not bonded in the bonding apparatus 41.

That is to say, in the second embodiment, in the test mode, the process of delivering the upper wafer W1 or the like and the process of taking out the upper wafer W1 or the like not bonded can be performed at the same time or consecutively. This makes it possible to shorten the processing time of the bonding system 1.

Furthermore, by configuring the transfer device 161 as described above, it is possible to reduce the size of the transfer device 161. That is to say, for example, if the driving parts are respectively connected to the third holding part 62c and the fourth holding part 62d, the number of driving parts increases, and the size of the transfer device 161 grows larger. However, in the transfer device 161 according to the second embodiment, the third and fourth holding parts 62c and 64d are driven together by one second driving part 66. This makes it possible to reduce the size of the transfer device 161.

As the third holding part 62c and the fourth holding part 62d described above, similar to the first and second holding parts 62a and 62b, it may be possible to use a bifurcated fork whose lateral width is smaller than the diameter of the upper wafer W1 or the like. However, the present disclosure is not limited thereto.

In the second embodiment, the transfer device 161 is provided with the third holding part 62c and the fourth holding part 62d. However, the present disclosure is not limited thereto. The transfer device 161 may be configured to include one of the third and fourth holding parts 62c and 62d.

In the above-described first and second embodiments, the number of the load lock chambers 31 is one. However, the number of the load lock chambers 31 is not limited thereto and may be two or more. In addition, the number of the transitions 31a1 and 31a2 disposed in the load lock chamber 31 may be one or three or more.

In the bonding system 1 described above, the substrate temperature control device 42 is disposed adjacent to the bonding apparatus 41. However, the present disclosure is not limited thereto. For example, the substrate temperature control device 42 may be disposed at another location such as the third processing block G3 or the like. Furthermore, in the bonding system 1, the substrate temperature control device 42 may be removed.

In the above description, the upper wafer W1 or the like is held by vacuum suction or mounting. However, the present disclosure is not limited thereto. For example, a mechanical chuck for mechanically holding a substrate or an electrostatic chuck for holding a substrate with an electrostatic attraction force may be appropriately used.

Figure 19A:
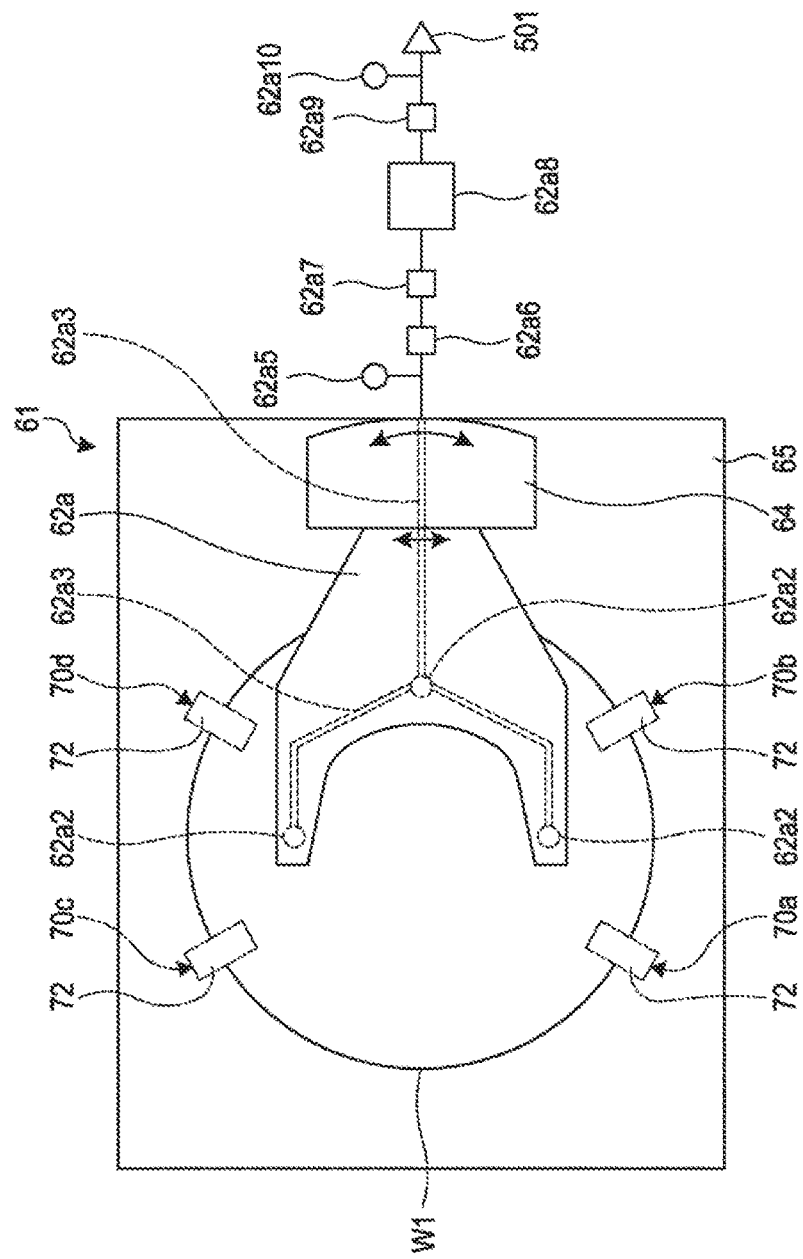
FIG. 19A is a view showing a modification of the transfer device shown in FIG. 6A.
Figure 19B:
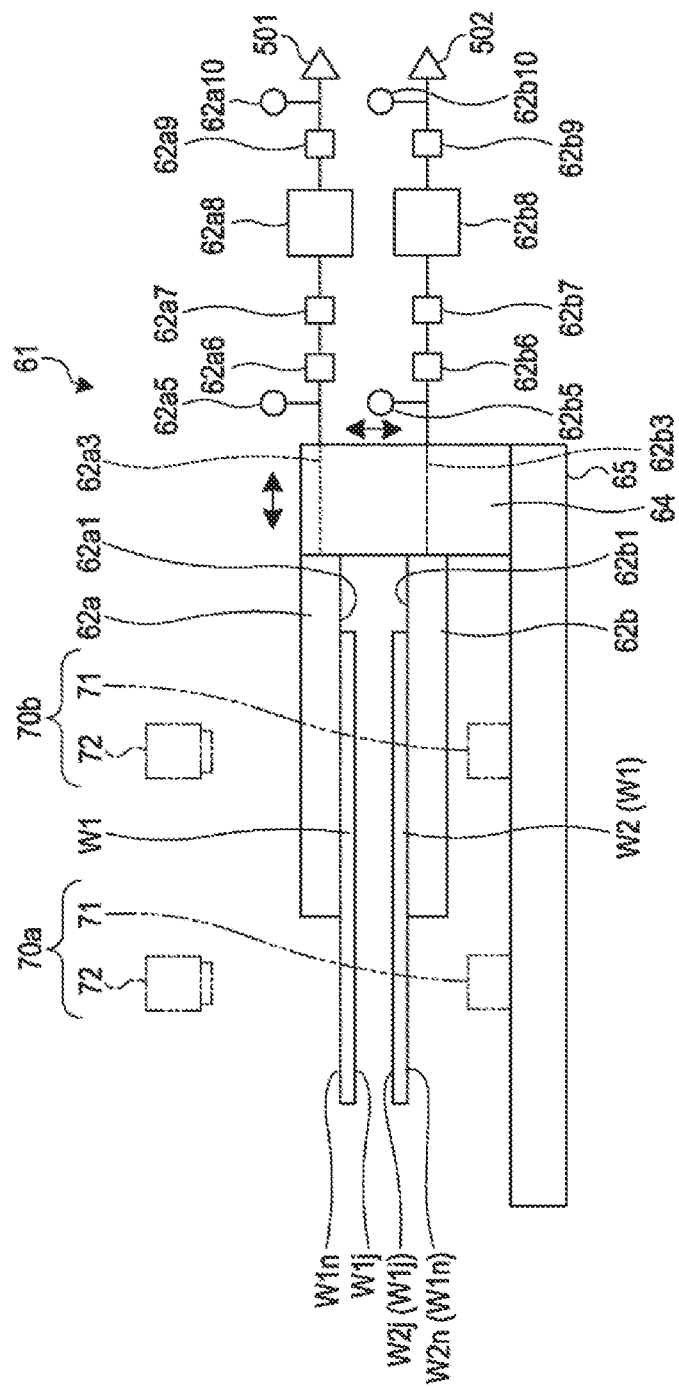
FIG. 19B is a view showing a modification of the transfer device shown in FIG. 6B.

In the above description, the transfer device 61 according to the first embodiment is exemplified based on FIGS. 6A and 6B and the transfer device 161 according to the second embodiment is exemplified based on FIG. 18. However, the present disclosure is not limited thereto and various modifications are available. FIGS. 19A and 19B show modifications of the transfer device 61 according to the first embodiment. In the following description, the configurations common to those of the first embodiment will be designated by like reference numerals and the description thereof will be omitted.

FIG. 19A is a view showing a modification of the transfer device 61 shown in FIG. 6A. In FIG. 19A, a pressure gauge 62a5, a flow path throttle member 62a6, an opening/closing valve 62a7, a tank 62a8, an opening/closing valve 62a9, and a pressure gauge 62a10 are additionally disposed in the named order. One end of the pressure gauge 62a10 is connected to a negative pressure source 501 on the factory side. The pressure gauge 62a5, the opening/closing valve 62a7, the opening/closing valve 62a9, and the pressure gauge 62a10 are connected to the control device 100 via signal lines. The detection values of the pressure gauge 62a5 and the pressure gauge 62a10 are sent to the control device 100. The opening and closing of the opening/closing valve 62a7 and the opening/closing valve 62a9 is controlled by the control device 100.

The pressure gauge 62a5 may be used to determine the existence or absence of the wafer W1 in the first holding part 62a. The detection value of the pressure gauge 62a5 may indicate a relative pressure with respect to the atmospheric pressure. For example, the detection value is 0 in the case of atmospheric pressure. Further, the negative value of the detection value becomes large if the relative pressure is close to vacuum.

The control device 100 is configured to determine the existence or absence of the wafer W1 by comparing the magnitude of the detection value of the pressure gauge 62a5 with a predetermined value. When the detection value (for example, −60 Kpa) of the pressure gauge 62a5 is closer to vacuum than the predetermined value (for example, −30 KPa), the control device 100 may determine that the wafer W1 exists in the first holding part 62a. Conversely, when the detection value of the pressure gauge 62a5 is closer to atmospheric pressure than the predetermined value, the control device 100 may determine that the wafer W1 does not exist in the first holding part 62a.

The throttle member 62a6 may improve the detection responsiveness of the pressure gauge 62a5. For example, the determination accuracy of the existence or absence of the wafer W1 described above may be improved. Since the time until the detection value of the pressure gauge 62a5 is stabilized becomes short, it is possible to shorten the time to determine the existence or absence of the wafer W1. The flow path (having an inner diameter of, for example, 2 mm) of the throttle member 62a6 may be formed to be narrower than the flow paths (having an inner diameter of, for example, 8 mm) on the front and back sides of the throttle member 62a6. By throttling a part of the flow path with the throttle member 62a6, it may be possible to improve the detection responsiveness of the pressure gauge 62a5. The opening/closing valve 62a7 may be opened when the wafer W1 is sucked and held by the first holding part 62a. Otherwise, the opening/closing valve 62a7 may be closed.

The tank 62a8 may function as a negative pressure buffer. The tank 62a8 may continue to suck the wafer W1 on the first holding part 62a so as to prevent the wafer W1 from dropping down even when the negative pressure source 501 on the factory side is stopped abnormally. The inside of the tank 62a8 is kept at the same negative pressure as the negative pressure source 501 on the factory side in a normal state. The opening/closing valve 62a9 is opened in a normal state. When the control device 100 determines that the negative pressure source 501 on the factory side has abnormally stopped based on the detection value of the pressure gauge 62a10, the opening/closing valve 62a9 is closed. If the opening/closing valve 62a9 is closed, the wafer W1 sucked and held by the first holding part 62a can be continuously held by the negative pressure in the tank 62a8 for a certain time. If the wafer W1 is recovered from the first holding part 62a during the certain time, it is possible to recover the wafer W1 without dropping from the first holding part 62a.

The pressure gauge 62a10 may be used to determine an operation status of the negative pressure source 501. Based on the detection value of the pressure gauge 62a10, the operation (normal state) or non-operation (abnormal state) of the negative pressure source 501 on the factory side is determined. When the detection value of the pressure gauge 62a10 is closer to vacuum than a predetermined value, the control device 100 may determine that the negative pressure source 501 on the factory side is in operation. Conversely, when the detection value of the pressure gauge 62a10 is closer to atmospheric pressure than the predetermined value, the control device 100 may determine that the negative pressure source 501 has abnormally stopped.

FIG. 19B is a view showing a modification of the transfer device 61 shown in FIG. 6B. This modification is an example applied to the second holding part 62b. In FIG. 19B, a pressure gauge 62b5, a flow path throttle member 62b6, an opening/closing valve 62b7, a tank 62b8, an opening/closing valve 62b9, and a pressure gauge 62b10 are additionally connected to the suction pipe 62b3 in the named order. One end of the pressure gauge 62b10 is connected to a negative pressure source 502 on the factory side. The pressure gauge 62b5, the flow path throttle member 62b6, the opening/closing valve 62b7, the tank 62b8, the opening/closing valve 62b9, and the pressure gauge 62b10 may have the same (or similar) functions, structures, and features as the pressure gauge 62a5, the flow path throttle member 62a6, the opening/closing valve 62a7, the tank 62a8, the opening/closing valve 62a9, and the pressure gauge 62a10, respectively. The pressure gauge 62b5, the flow path throttle member 62b6, the opening/closing valve 62b7, the tank 62b8, the opening/closing valve 62b9, and the pressure gauge 62b10 are related with the second holding part 62b.

FIG. 20 shows a modification of the transfer device 161 shown in FIG. 18 according to the second embodiment. This modification is an example applied to the third holding part 62c and the fourth holding part 62d. In the following description, the configurations common to those of the second embodiment will be designated by like reference numerals and the description thereof will be omitted. Further, the configurations common to those of the modifications of the first embodiment shown in FIGS. 19A and 19B will also be designated by like reference numerals and the description thereof will be omitted.

As shown in FIG. 20, a pressure gauge 62c5, a flow path throttle member 62c6, an opening/closing valve 62c7, a tank 62c8, an opening/closing valve 62c9, and a pressure gauge 62c10 are additionally connected to the suction pipe 62c3 in the named order. One end of the pressure gauge 62c10 is connected to a negative pressure source 503 on the factory side. Further, a pressure gauge 62d5, a flow path throttle member 62d6, an opening/closing valve 62d7, a tank 62d8, an opening/closing valve 62d9, and a pressure gauge 62d10 are additionally connected to the suction pipe 62d3 in the named order. One end of the pressure gauge 62d10 is connected to a negative pressure source 504 on the factory side.

The pressure gauges 62c5 and 62d5, the flow path throttle members 62c6 and 62d6, the opening/closing valves 62c7 and 62d7, the tanks 62c8 and 62d8, the opening/closing valves 62c9 and 62d9, and the pressure gauges 62c10 and 62d10 may have the same (or similar) functions, structures, and features as the pressure gauge 62a5, the flow path throttle member 62a6, the opening/closing valve 62a7, the tank 62a8, the opening/closing valve 62a9, and a pressure gauge 62a10, respectively. The pressure gauge 62c5, the flow path throttle member 62c6, the opening/closing valve 62c7, the tank 62c8, the opening/closing valve 62c9, and the pressure gauge 62c10 are related with the third holding part 62c. Further, the pressure gauge 62d5, the flow path throttle member 62d6, the opening/closing valve 62d7, the tank 62d8, the opening/closing valve 62d9, and the pressure gauge 62d10 are related with the fourth holding part 62d.

According to the present disclosure in some embodiments, it is possible to shorten a processing time of bonding substrates in a bonding apparatus.

Additional effects and modifications can be easily derived by those skilled in the art. Thus, the broader aspects of the present disclosure are not limited to the specific details and representative embodiments shown and described as above. Accordingly, various modifications are available without departing from the spirit or scope of the general inventive concept as defined by the appended claims and their equivalents.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate transfer device for transferring a first substrate and a second substrate to a bonding apparatus configured to bond the first substrate and the second substrate, comprising:
   a first holding part configured to hold an upper surface of the first substrate, a lower surface of the first substrate serving as a first bonding surface;
   a second holding part provided below the first holding part and configured to hold a lower surface of the second substrate such that an upper surface of the second substrate faces the lower surface of the first substrate, the upper surface of the second substrate serving as a second bonding surface to be bonded to the lower surface of the first substrate; and
   a first driving part connected to the first holding part and the second holding part, and configured to transfer the first substrate and the second substrate to the bonding apparatus while the first holding part and second holding part hold the first substrate and the second substrate, respectively.

2. The substrate transfer device of claim 1, wherein the first holding part is configured to hold the first substrate by vacuum suction, and
   the second holding part is configured to hold the second substrate by vacuum suction.

3. The substrate transfer device of claim 2, further comprising a third holding part configured to hold at least one selected from a group consisting of a laminated substrate in which the first substrate and the second substrate are bonded, the first substrate not bonded by the bonding apparatus, and the second substrate not bonded by the bonding apparatus.

4. The substrate transfer device of claim 3, further comprising a second driving part connected to the third holding part and configured to drive the third holding part.

5. The substrate transfer device of claim 4, further comprising a fourth holding part provided above the third holding part and configured to hold at least one selected from a group consisting of the laminated substrate in which the first substrate and the second substrate are bonded, the first substrate not bonded by the bonding apparatus, and the second substrate not bonded by the bonding apparatus.

6. The substrate transfer device of claim 5, wherein the second driving part is connected to the third holding part and the fourth holding part and configured to drive both the third holding part and the fourth holding part.

7. The substrate transfer device of claim 1, further comprising a position detecting part disposed in a direction perpendicular to the surfaces of the first substrate held by the first holding part or the surfaces of the second substrate held by the second holding part, and capable of detecting a position of a peripheral edge of the first substrate held by the first holding part or a position of a peripheral edge of the second substrate held by the second holding part,
   wherein when one substrate of the first substrate and the second substrate is held as an initially-held substrate by the first holding part or the second holding part, and then the other substrate of the first substrate and the second substrate is held by the first holding part or the second holding part as an additionally-held substrate in which the additionally-held substrate is overlapped with the initially-held substrate in a plan view, the position detecting part is configured to detect a position of a peripheral edge of the initially-held substrate before the additionally-held substrate is held, to detect positions of peripheral edges of the initially-held substrate and the additionally-held substrate after the additionally-held substrate is held, and to detect a position of a peripheral edge of the additionally-held substrate based on a deviation between the detected position of the peripheral edge of the initially-held substrate and the detected positions of the peripheral edges of the initially-held substrate and the additionally-held substrate.

* * * * *